(12) United States Patent
Lin

(10) Patent No.: US 12,727,158 B2
(45) Date of Patent: Sep. 1, 2026

(54) READ-ONLY MEMORY DEVICE AND METHOD

(71) Applicant: TAIWAN SEMICONDUCTOR MANUFACTURING COMPANY, LTD., Hsinchu (TW)

(72) Inventor: Ku-Feng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 331 days.

(21) Appl. No.: 18/446,696

(22) Filed: Aug. 9, 2023

(65) Prior Publication Data

US 2024/0341092 A1 Oct. 10, 2024

Related U.S. Application Data

(60) Provisional application No. 63/457,867, filed on Apr. 7, 2023.

(51) Int. Cl.
*G11C 17/00* (2006.01)
*G11C 17/12* (2006.01)
*H10B 20/00* (2023.01)

(52) U.S. Cl.
CPC ............. *H10B 20/50* (2023.02); *G11C 17/12* (2013.01); *H10B 20/34* (2023.02)

(58) Field of Classification Search
CPC ........ H10B 20/50; H10B 20/34; H10B 20/54; G11C 17/12
USPC .......................................................... 365/104
See application file for complete search history.

(56) References Cited

U.S. PATENT DOCUMENTS 6,778,419 B2 * 8/2004 Barry ..................... G11C 17/12 365/72
7,512,764 B2 * 3/2009 Chang ............... H03M 13/2782 711/170
7,848,171 B2 * 12/2010 Miyako ................. G11C 11/413 365/228
8,552,763 B2 * 10/2013 Abe ....................... H10B 43/30 326/119
8,605,480 B2 12/2013 Jain et al.
9,460,797 B2 10/2016 Chen et al.
10,679,714 B2 * 6/2020 Singh ..................... G11C 17/08
10,726,908 B2 * 7/2020 Jeloka ...................... G11C 7/12
(Continued)

FOREIGN PATENT DOCUMENTS

KR 10-2023-0018990 2/2023
TW 202207420 2/2022
(Continued)

*Primary Examiner* — Viet Q Nguyen
(74) *Attorney, Agent, or Firm* — Hauptman Ham, LLP

(57) ABSTRACT

A read-only memory (ROM) device includes a complementary field effect transistor (CFET) device which has a first semiconductor device of a first type, and a second semiconductor device of a second type different from the first type. The second semiconductor device is over or under the first semiconductor device. A first word line is electrically coupled to a gate of the first semiconductor device. A second word line is electrically coupled to a gate of the second semiconductor device. At least one bit line is electrically coupled to at least one of a first source/drain of the first semiconductor device, or a first source/drain of the second semiconductor device.

20 Claims, 23 Drawing Sheets

(56) References Cited

U.S. PATENT DOCUMENTS

| | | | | |
|---|---|---|---|---|
| 11,049,539 | B1 * | 6/2021 | Sanjeevarao | G11C 11/1655 |
| 11,114,175 | B1 * | 9/2021 | Singh | G11C 17/123 |
| 11,532,352 | B2 * | 12/2022 | Siddiqui | G11C 11/412 |
| 11,862,219 | B2 * | 1/2024 | Young | H10D 64/689 |
| 2005/0007809 | A1 | 1/2005 | Barry et al. | |
| 2009/0168490 | A1 * | 7/2009 | Madan | H10B 53/00<br>257/295 |
| 2018/0122478 | A1 * | 5/2018 | Morris | H10B 53/00 |
| 2020/0235098 | A1 | 7/2020 | Li et al. | |
| 2021/0375344 | A1 * | 12/2021 | Young | G11C 11/2275 |
| 2023/0164975 | A1 * | 5/2023 | Chiang | H10B 12/50<br>257/296 |
| 2024/0161817 | A1 * | 5/2024 | Augustine | G11C 11/419 |

FOREIGN PATENT DOCUMENTS

| | | |
|---|---|---|
| TW | 202309911 | 3/2023 |
| TW | I794748 | 3/2023 |

* cited by examiner

READ-ONLY MEMORY DEVICE AND METHOD

RELATED APPLICATION(S)

This application claims the benefit of U.S. Provisional Application No. 63/457,867, filed Apr. 7, 2023, which is incorporated herein by reference in its entirety.

BACKGROUND

An integrated circuit ("IC") device includes one or more semiconductor devices represented in an IC layout diagram (also referred to as "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

To reduce the sizes of IC devices, sometimes a layer of semiconductor devices is formed, or bonded, over another layer of semiconductor devices. Examples include complementary field effect transistor (CFET) devices in which an upper or top semiconductor device overlies a lower or bottom semiconductor device in a stack configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
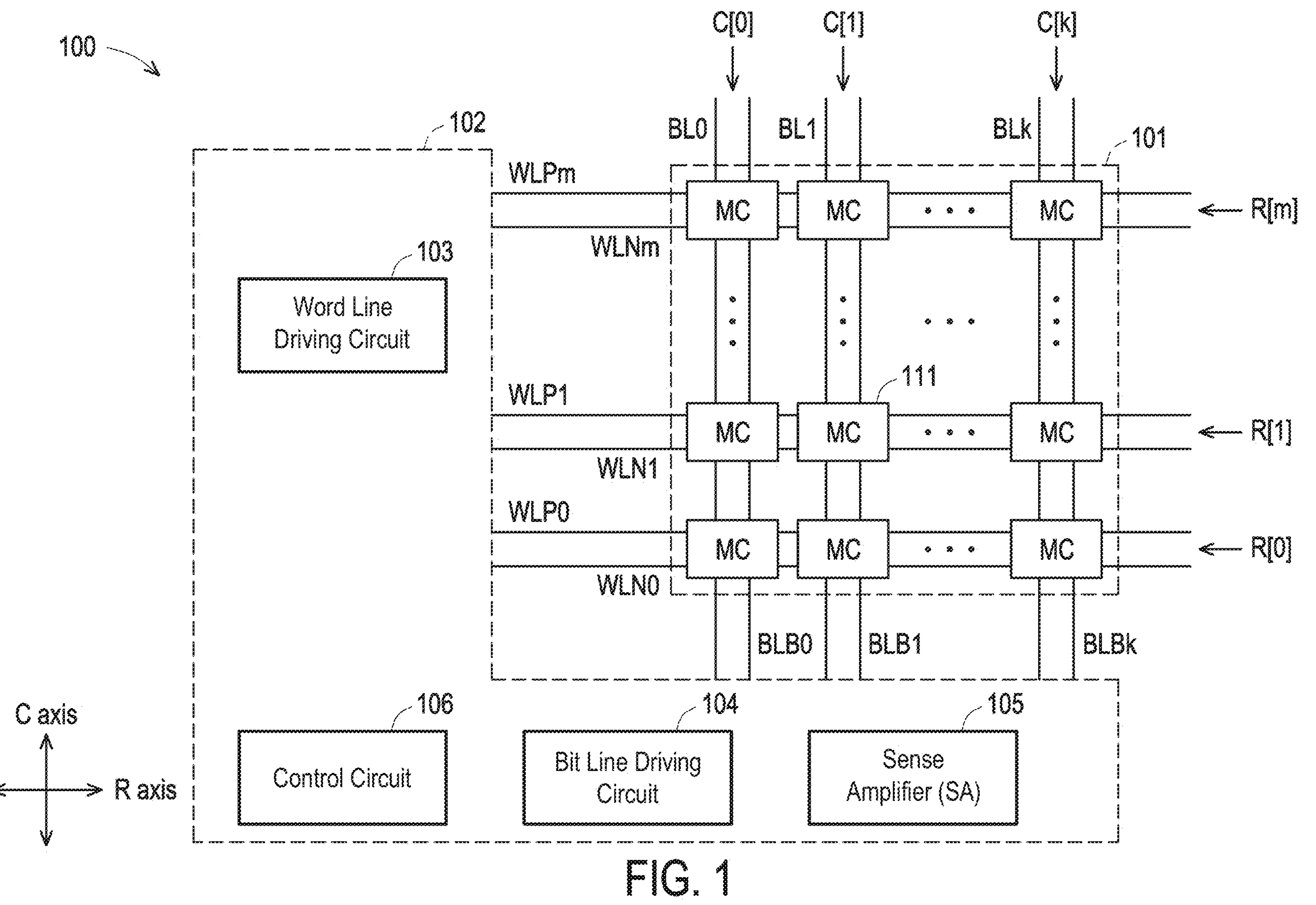
FIG. 1 is a schematic block diagram of a memory device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a read-only memory (ROM) device comprises a complementary field effect transistor (CFET) device as a memory cell. In some embodiments, a top semiconductor device of the CFET device and a bottom semiconductor device of the CFET device are configured to store two bits of data independently from each other. This configuration, in one or more embodiments, provides a high density ROM device with about 50% improvement in bit cell area and/or density scaling, at the same technology node or feature size. In some embodiments, the top semiconductor device and the bottom semiconductor device of the CFET device are configured to store, together, a bit of data. This configuration, in one or more embodiments, provides a high speed ROM device with about 50% speed improvement in bit line delay, compared to other approaches with single-ended sensing. In some embodiments, a particular logic value (or bit of data) is stored by the top semiconductor device and/or the bottom semiconductor devices, depending on an electrical connection, or lack thereof, between a source/drain of the top or bottom semiconductor device and a bit line or a power rail.

FIG. 1 is a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities. The memory device 100 is a ROM device.

The memory device 100 comprises a memory array 101 of a plurality of memory cells MC, and a memory controller 102 coupled to control an operation of the memory cells MC. In the memory array 101, the memory cells MC are arranged in a plurality of columns C[0]-C[k], where k is a natural number, and rows R[0]-R[m], where m is a natural number which is the same as or different from k. Columns and rows in a memory array are sometimes referred to as memory columns and memory rows. The memory columns extend in a column direction, designated as C axis in the drawings. The memory rows extend in a row direction transverse to the column direction, and designated as R axis in the drawings. Each memory cell MC comprises a CFET device. As described herein, a CFET device comprises a first semiconductor device, and a second semiconductor device over or under the first semiconductor device. The first semiconductor device is of a first type, and the second semiconductor device is of a second type different from the first type. In at least one embodiment, the first type is a P-type and the second type is an N-type. In one or more embodiments, the first type is the N-type and the second type is a P-type.

The memory device 100 further comprises a plurality of word lines extending along the rows of the memory array 101, and a plurality of bit lines extending along the columns of the memory array 101. The word lines are commonly referred to herein with a label WL, and the bit lines are commonly referred to herein with a label BL.

Each memory cell MC is coupled to the memory controller 102 by a pair of word lines correspondingly labelled as WLP (e.g., WLP0, WLP1 to WLPm) and WLN (e.g., WLN0, WLN1 to WLNm). The word line WLP is electrically coupled to a P-type semiconductor device in a CFET device of the memory cell MC. The word line WLN is electrically coupled to an N-type semiconductor device in the CFET device of the memory cell MC. For example, a memory cell 111 in the memory array 101 comprises a CFET device which, in turn, comprises a P-type semiconductor device coupled to the word line WLP1, and an N-type semiconductor device coupled to the word line WLN1. The word lines are configured for transmitting addresses of memory cells MC to be read from. The word lines are sometimes referred to as "address lines." In some embodiments, each word line in a pair of word lines WLP, WLN is configured to carry an address signal, or access voltage, independently of the other word line in the pair. One or more non-limiting examples of this configuration are described with respect to FIGS. 2A-4C. In some embodiments, a pair of word lines WLP, WLN is configured to correspondingly carry a pair of address signals, or access voltage, which are related, or correspond, to each other. For example, one address signal in the pair of address signals is an inverted signal of the other address signal. One or more non-limiting examples of this configuration are described with respect to FIGS. 5A-7B.

In the example configuration in FIG. 1, each memory cell MC is coupled to the memory controller 102 by a pair of differential bit lines correspondingly labelled as BL (e.g., BL0, BL1 to BLk) and BLB (e.g., BLB0, BLB1 to BLBk). In some embodiments, one of the bit line in the pair of differential bit lines is omitted. For example, the bit lines BL0, BL1 to BLk are omitted in one or more embodiments. For another example, the bit lines BLB0, BLB1 to BLBk are omitted in some embodiments. The bit lines are configured for transmitting data read from the memory cells MC indicated by the addresses on the corresponding word lines. The bit lines are sometimes referred to as "data lines." Various numbers of word lines and/or bit lines in the memory device 100 are within the scope of various embodiments.

In the example configuration in FIG. 1, the memory controller 102 comprises a word line driving circuit 103, a bit line driving circuit 104, a sense amplifier 105, and a control circuit 106. Various quantities of word line driving circuits, and/or bit line driving circuits, and/or sense amplifiers are within the scopes of various embodiments.

The word line driving circuit 103 is configured to decode a row address of one or more memory cells MC selected to be accessed in a read operation. For example, the word line driving circuit 103 comprises a plurality of word line drivers, or the like, each coupled to one or more word lines of the memory array 101. The word line driving circuit 103 is configured to supply, through the corresponding word line drivers, or the like, a set of access voltages to the selected word line(s) corresponding to the decoded row address, and a different set of voltages (e.g., zero) to the other, unselected word lines.

The bit line driving circuit 104 is configured to decode a column address of one or more memory cells MC selected to be accessed in a read operation. In some embodiments, the bit line driving circuit 104 comprises one or more bit line multiplexers each coupled to one or more bit lines of the memory array 101. The bit line driving circuit 104 is configured to supply, through the bit line multiplexers, a set of voltages to the selected bit line(s) corresponding to the selected memory cells MC to be accessed, and a different set of voltages to the other, unselected bit lines. In at least one embodiment, unselected bit lines are left floating. For example, the bit line driving circuit 104 comprises one or more pre-charging circuits configured to pre-charge the selected bit line(s) to a pre-charge voltage in a read operation.

The sense amplifier 105 is configured to sense, and output, data read from the accessed memory cells MC and retrieved through the corresponding bit line(s) which has/have been pre-charged.

The control circuit 106 is configured to control operations of the word line driving circuit 103, bit line driving circuit 104, sense amplifier 105 and/or other components in the memory controller 102. In at least one embodiment, the memory controller 102 further includes one or more clock generators for providing clock signals for various components of the memory device 100, one or more input/output (I/O) circuits for data exchange with external devices, and/or one or more sub-controllers for controlling various operations in the memory device 100. The described memory device configuration is an example, and other memory device configurations are within the scopes of various embodiments.

FIGS. 2A-2D are schematic circuit diagrams of various memory cells 200A-200D, in accordance with some embodiments. In some embodiments, each of the memory cells 200A-200D corresponds to one or more memory cells MC in the memory device 100. As described herein, the memory cells 200A-200D differ from each other by data stored therein. For simplicity, corresponding components in FIGS. 2A-2D are designated by the same reference numerals.

Figure 2A:
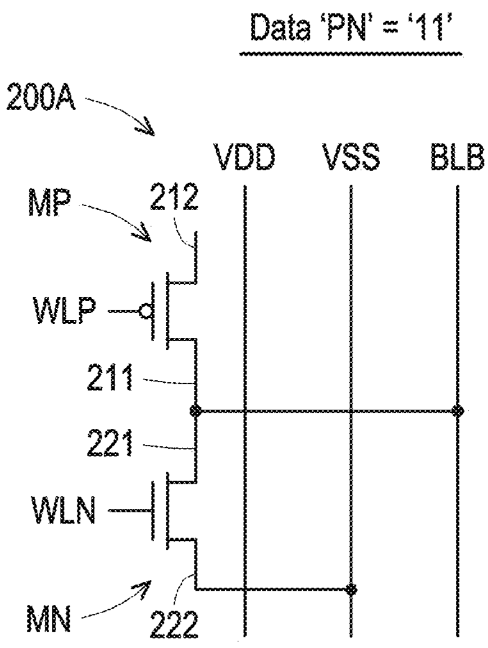
FIGS. 2A-2D are schematic circuit diagrams of various memory cells, in accordance with some embodiments.

In FIG. 2A, the memory cell 200A comprises a CFET device which, in turn, comprises a first semiconductor device of a first type, and a second semiconductor device of a second type different from the first type. For example, the first semiconductor device of the first type is a P-type semiconductor device such as a transistor MP, and the second semiconductor device of the second type is an N-type semiconductor device such as a transistor MN. One of the transistor MP and transistor MN is physically over the other. The circuit arrangement of the transistor MP and transistor MN in FIG. 2A does not necessarily correspond to the physical arrangement of the transistors in the CFET device. In some embodiments, the transistor MP is physically over the transistor MN. In some further embodiments, the transistor MN is physically over the transistor MP. The transistor MP comprises a first source/drain 211, a second source/drain 212, and a gate (not numbered). The transistor MN comprises a first source/drain 221, a second source/drain 222, and a gate (not numbered).

A first word line is electrically coupled to the gate of the first semiconductor device of the CFET device, and a second word line is electrically coupled to the gate of the second semiconductor device of the CFET device. For example, a word line WLP is electrically coupled to the gate of the transistor MP, and a corresponding word line WLN is electrically coupled to the gate of the transistor MN. In some embodiments, the word line WLP corresponds to one or more of the word lines WLP0, WLP1 to WLPm, and the word line WLN corresponds to one or more of the word lines WLN0, WLN1 to WLNm, described with respect to FIG. 1.

At least one bit line is electrically coupled to at least one of the first source/drain of the first semiconductor device, or the first source/drain of the second semiconductor device. In the example configuration in FIG. 2A, a bit line BLB is electrically coupled to both the first source/drain 211 of the transistor MP and the first source/drain 221 of the transistor MN. In some embodiments, the bit line BLB corresponds to one or more of the bit lines BLB0, BLB1 to BLBk, described with respect to FIG. 1.

A first power rail configured to carry a first power supply voltage, and a second power rail configured to carry a second power supply voltage different from the first power supply voltage are provided for the memory cell 200A. In the example configuration in FIG. 2A, the first power rail is configured to carry a power supply voltage VDD and is referred to herein as a VDD power rail, and the second power rail is configured to carry a reference voltage, e.g., the ground voltage VSS, and is referred to herein as a VSS power rail. In some embodiments, the first power rail is a VSS power rail, and the second power rail is a VDD power rail.

An electrical connection, or lack thereof, between the second source/drain 212 of the transistor MP and the VDD power rail corresponds to a first logic value, or a second logic value different from the first logic value, stored in the transistor MP. In the example configurations in FIGS. 2A, 2B, the second source/drain 212 is electrically disconnected from the VDD power rail. This electrical disconnection between the second source/drain 212 and the VDD power rail corresponds to logic "1" stored in the transistor MP. In the example configurations in FIGS. 2C, 2D, the second source/drain 212 is electrically connected to the VDD power rail. This electrical connection between the second source/drain 212 and the VDD power rail corresponds to logic "0" stored in the transistor MP.

An electrical connection, or lack thereof, between the second source/drain 222 of the transistor MN and the VSS power rail corresponds to the second logic value, or the first logic value, stored in the transistor MN. In the example configurations in FIGS. 2A, 2C, the second source/drain 222 is electrically connected to the VSS power rail. This electrical connection between the second source/drain 222 and the VSS power rail corresponds to logic "1" stored in the transistor MN. In the example configurations in FIGS. 2B, 2D, the second source/drain 222 is electrically disconnected from the VSS power rail. This electrical disconnection between the second source/drain 222 and the VSS power rail corresponds to logic "0" stored in the transistor MN.

The logic values correspondingly stored in the transistor MP and transistor MN of the CFET device are schematically designated as data PN in FIGS. 2A-2D.

In FIG. 2A, the data PN of the memory cell 200A are "11," with logic "1" being stored in both the transistor MP and the transistor MN. The data PN of "11" correspond to the electrical disconnection between the second source/drain 212 and the VDD power rail, and the electrical connection between the second source/drain 222 and the VSS power rail.

Figure 2B:
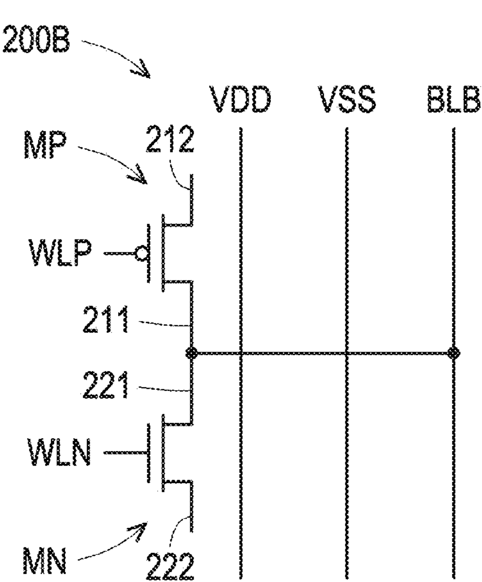

In FIG. 2B, the data PN of the memory cell 200A are "10," with logic "1" being stored in the transistor MP and logic "0" being stored in the transistor MN. The data PN of "10" correspond to the electrical disconnection between the second source/drain 212 and the VDD power rail, and the electrical disconnection between the second source/drain 222 and the VSS power rail.

Figure 2C:
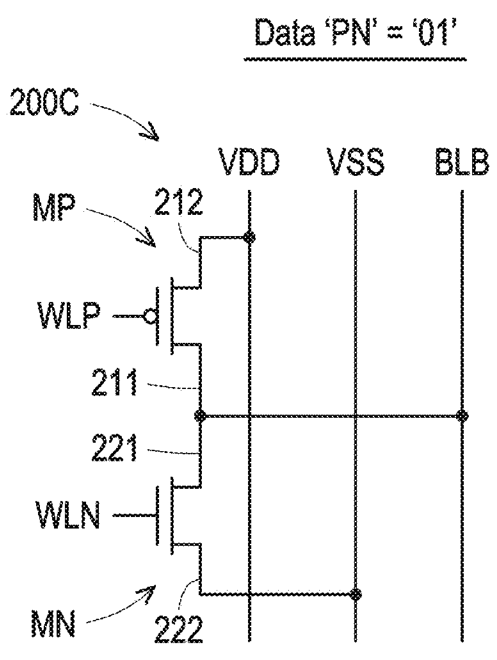

In FIG. 2C, the data PN of the memory cell 200A are "01," with logic "0" being stored in the transistor MP and logic "1" being stored in the transistor MN. The data PN of "01" correspond to the electrical connection between the second source/drain 212 and the VDD power rail, and the electrical connection between the second source/drain 222 and the VSS power rail.

Figure 2D:
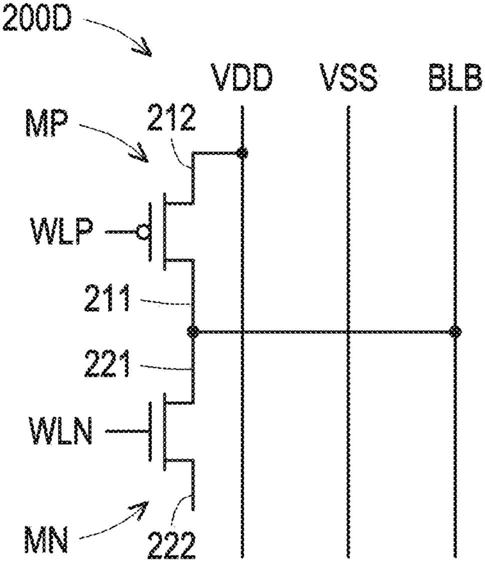

In FIG. 2D, the data PN of the memory cell 200A are "00," with logic "0" being stored in both the transistor MP and the transistor MN. The data PN of "00" correspond to the electrical connection between the second source/drain 212 and the VDD power rail, and the electrical disconnection between the second source/drain 222 and the VSS power rail.

The memory cells 200A-200D are examples showing that the transistor MP is configured to store a logic value independently of a logic value stored in the transistor MN, and vice versa. Similarly, the logic value stored in the transistor MP is read or accessed independently of the logic value stored in the transistor MN, and vice versa. Example read operations for accessing or reading data from one or more of the memory cells 200A-200D are described herein below.

Figure 2E:
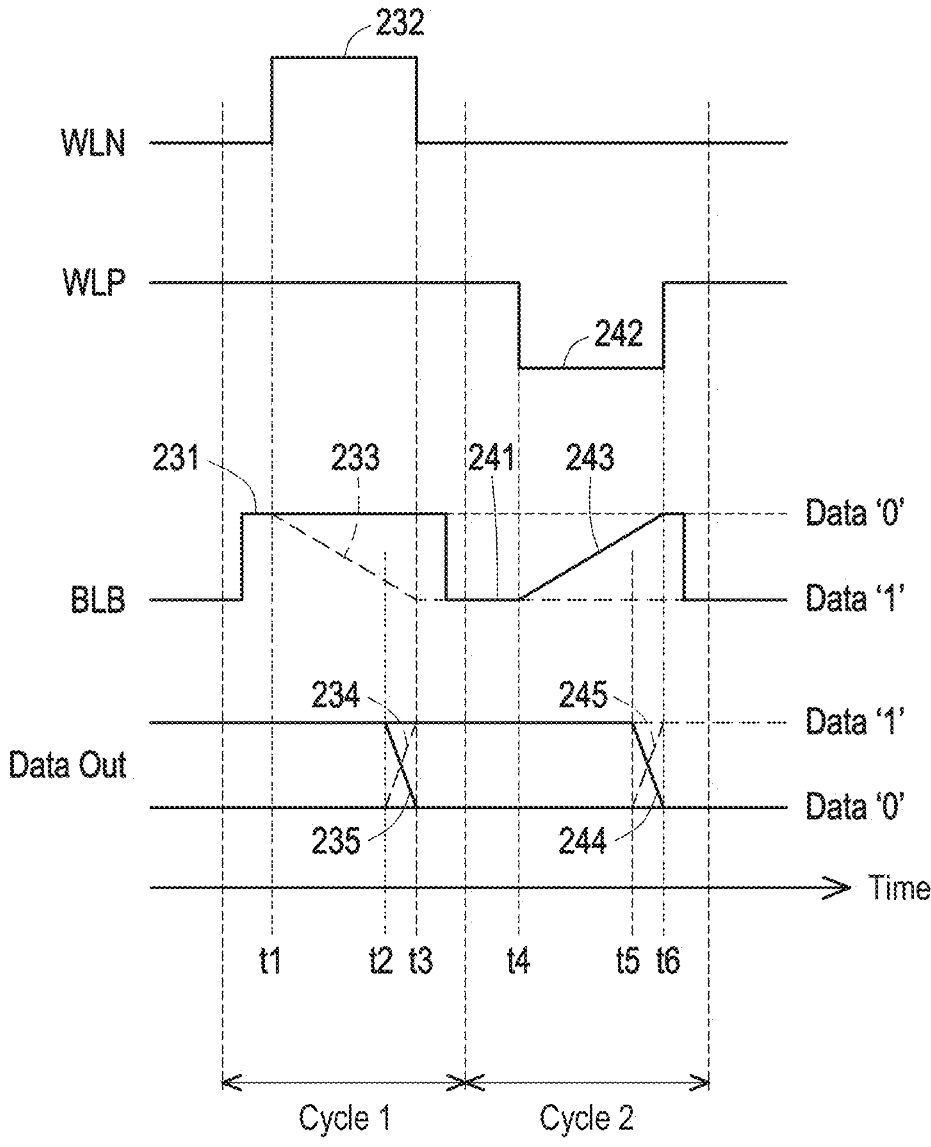
FIG. 2E is a timing diagram showing read operations of one or more memory cells, in accordance with some embodiments.

FIG. 2E is a timing diagram showing read operations of one or more of the memory cells 200A-200D, in accordance with some embodiments. The timing diagram in FIG. 2E shows voltages on the word line WLN, word line WLP, bit line BLB and at an output (Data Out) of a sense amplifier coupled to the bit line BLB. The voltages on the bit line BLB and at the output Data Out when a logic "1" is read are shown by broken (dot-dot) lines. The voltages on the bit line BLB and at the output Data Out when a logic "0" is read are shown by solid lines.

The read operation in FIG. 2E includes a first cycle, i.e., Cycle 1, for reading the logic value stored in the transistor MN, and a second cycle, i.e., Cycle 2, for reading the logic value stored in the transistor MP. In FIG. 2E, Cycle 2 immediately follows Cycle 1. This is an example. Other configurations are within the scopes of various embodiments. For example, Cycle 2 follows Cycle 1 after a time interval, or Cycle 1 immediately follows Cycle 2, or Cycle 1 follows Cycle 2 after a time interval. In other words, the read operation of the transistor MP is independent from the read operation of the transistor MN, and vice versa.

In Cycle 1, before accessing the transistor MN, the bit line BLB is pre-charged by a pre-charging circuit, as described with respect to FIG. 1, to a pre-charge voltage 231 of a high voltage level corresponding to logic “0.” An example pre-charging circuit comprises a pull-up circuit, such as a P-type transistor coupled between VDD and the bit line BLB. Other pre-charging circuit configurations and/or positive voltages are within the scopes of various embodiments.

When the bit line BLB has been pre-charged, an access voltage 232 is applied from a memory controller corresponding to the memory controller 102 to the word line WLN coupled to the gate of the transistor MN. At timing t1 corresponding to a rising edge of the access voltage 232, the access voltage 232 turns ON the transistor MN. The read operations of the transistors MN in the memory cells 200A-200D are similar to each other up to this point.

In the memory cells 200A, 200C in FIGS. 2A, 2C, because the second source/drain 222 is electrically coupled to the VSS power rail, the turned ON transistor MN electrically couples the VSS power rail to the bit line BLB. As a result, the voltage on the bit line BLB decreases from the pre-charge voltage 231, as indicated at 233.

At timing t2, the voltage on the bit line BLB reaches a level sufficient to be detected by a sense amplifier included in the memory controller and coupled to the bit line BLB. In at least one embodiment, the sense amplifier corresponds to the sense amplifier 105. An example sense amplifier comprises a single-ended sense amplifier which is configured to compare the voltage on the bit line BLB with a reference voltage. Specifically, at timing t2, a difference between the voltage of the bit line BLB and the reference voltage is sufficient to be detected by the sense amplifier, and causes a voltage at an output (Data Out) of the sense amplifier to switch. For example, the voltage at the output of the sense amplifier begins to rise from timing t2, as indicated at 234. A corresponding voltage at another, differential output of the sense amplifier, or another output circuit of the memory controller, begins to fall from timing t2, as indicated at 235.

At timing t3, the memory controller stops applying the access voltage 232 to the word line WLN. The voltage at the output of the sense amplifier reaches a high voltage level corresponding to logic “1.” As a result, the logic value, i.e., logic “1,” stored in the transistor MN of the memory cell 200A, 200C is read out.

In the memory cells 200B, 200D in FIGS. 2B, 2D, because the second source/drain 222 is electrically disconnected from the VSS power rail, the bit line BLB is not electrically coupled to the VSS power rail, despite that the transistor MN is turned ON. As a result, the voltage on the bit line BLB remains at the level of the pre-charge voltage 231 until and beyond timing t3 when the memory controller stops applying the access voltage 232. The voltage at the output (Data Out) of the sense amplifier remains at a low voltage level corresponding to logic “0”, and the corresponding voltage at another, differential output of the sense amplifier, or another output circuit of the memory controller, remains at a high voltage level. As a result, the logic value, i.e., logic “0,” stored in the transistor MN of the memory cell 200B, 200D is read out.

In Cycle 2, before accessing the transistor MP, the bit line BLB is pre-charged by a pre-charging circuit, as described with respect to FIG. 1, to a pre-charge voltage 241 of a low voltage level corresponding to logic “1.” An example pre-charging circuit comprises a pull-down circuit, such as an N-type transistor coupled between VSS and the bit line BLB. Other pre-charging circuit configurations are within the scopes of various embodiments.

When the bit line BLB has been pre-charged, an access voltage 242 is applied from the memory controller to the word line WLP coupled to the gate of the transistor MP. At timing t4 corresponding to a falling edge of the access voltage 242, the access voltage 242 turns ON the transistor MP. The read operations of the transistors MP in the memory cells 200A-200D are similar to each other up to this point.

In the memory cells 200A, 200B in FIGS. 2A, 2B, because the second source/drain 212 is electrically disconnected from the VDD power rail, the bit line BLB is not electrically coupled to the VDD power rail, despite that the transistor MP is turned ON. As a result, the voltage on the bit line BLB remains at the level of the pre-charge voltage 241 until and beyond timing t6 when the memory controller stops applying the access voltage 242. The voltage at the output (Data Out) of the sense amplifier remains at a high voltage level corresponding to logic “1”, and the corresponding voltage at another, differential output of the sense amplifier, or another output circuit of the memory controller, remains at a low voltage level. As a result, the logic value, i.e., logic “1,” stored in the transistor MP of the memory cell 200A, 200B is read out.

In the memory cells 200C, 200D in FIGS. 2C, 2D, because the second source/drain 212 is electrically connected to the VDD power rail, the turned ON transistor MP electrically couples the VDD power rail to the bit line BLB. As a result, the voltage on the bit line BLB increases from the pre-charge voltage 241, as indicated at 243.

At timing t5, the voltage on the bit line BLB reaches a level sufficient to be detected by a sense amplifier included in the memory controller and coupled to the bit line BLB. In at least one embodiment, the sense amplifier corresponds to the sense amplifier 105. An example sense amplifier comprises a single-ended sense amplifier which is configured to compare the voltage on the bit line BLB with a reference voltage. In some embodiments, this sense amplifier is the same as the sense amplifier for detecting a logic value read from the transistor MN. In at least one embodiment, different sense amplifiers are coupled to the bit line BLB for detecting data read from the transistor MP and transistor MN. In some embodiments, different reference voltages are used by the corresponding sense amplifier(s) for detecting data read from the transistor MP and transistor MN. Specifically, at timing t5, a difference between the voltage of the bit line BLB and the corresponding reference voltage is sufficient to be detected by the sense amplifier, and causes a voltage at the output of the sense amplifier to switch. For example, the voltage at the output (Data Out) of the sense amplifier begins to fall from timing t5, as indicated at 244. A corresponding voltage at another, differential output of the sense amplifier, or another output circuit of the memory controller, begins to rise from timing t5, as indicated at 245.

At timing t6, the memory controller stops applying the access voltage 242 to the word line WLP. The voltage at the output of the sense amplifier reaches a low voltage level corresponding to logic "0." As a result, the logic value, i.e., logic "0," stored in the transistor MP of the memory cell 200C, 200D is read out.

Figure 2F:
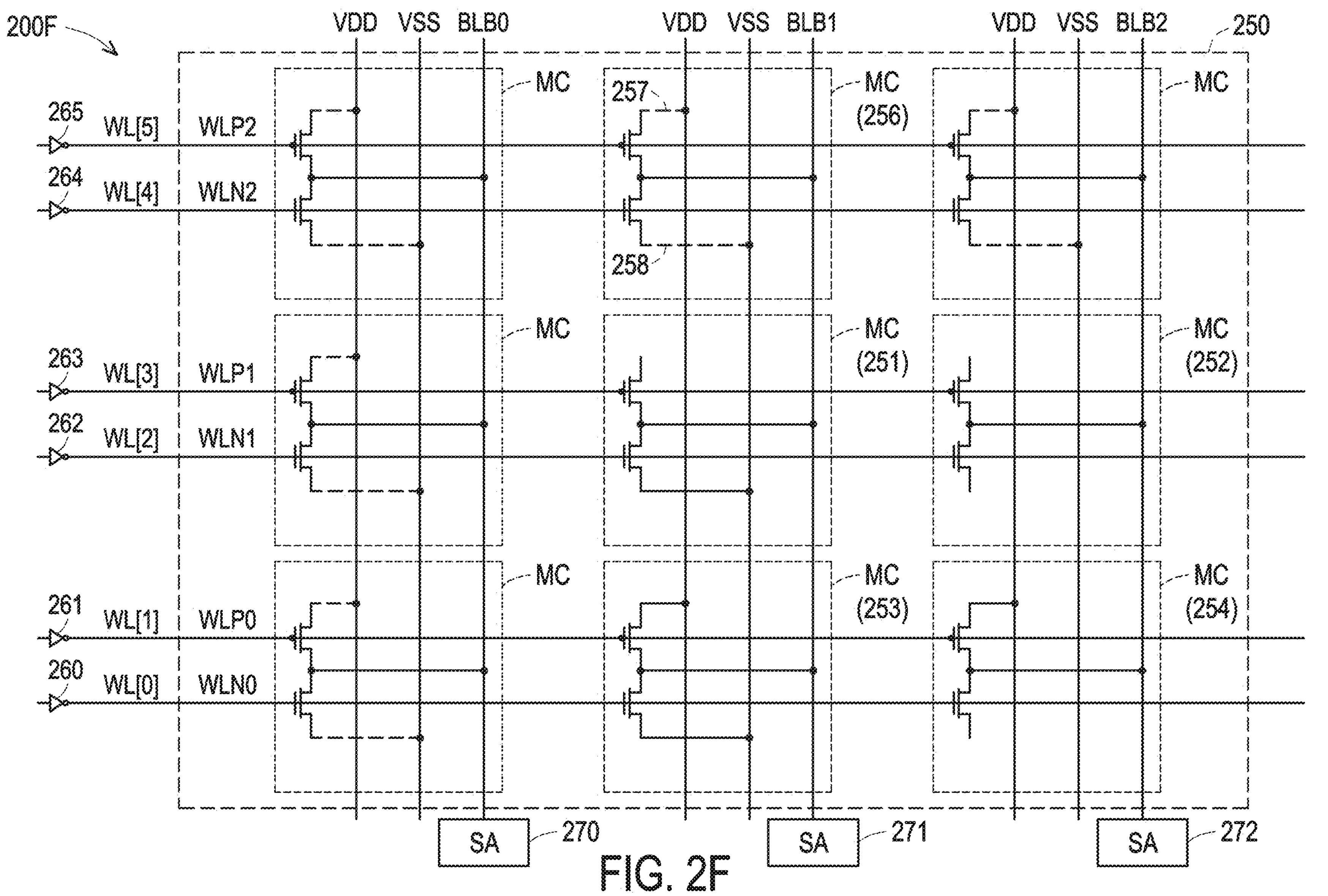
FIG. 2F is a schematic circuit diagram of a memory device, in accordance with some embodiments.

FIG. 2F is a schematic circuit diagram of a memory device 200F, in accordance with some embodiments. In some embodiments, the memory device 200F corresponds to the memory device 100, and includes components corresponding to those of the memory device 100. For simplicity, various components of the memory device 200F are omitted in FIG. 2F.

The memory device 200F comprises a memory array 250 of a plurality of memory cells MC, and a memory controller coupled to control an operation of the memory cells MC. The memory controller comprises word line drivers 260-265, and sense amplifiers 270-272. Other components of the memory controller are omitted for simplicity. The memory cells MC are coupled to the word line drivers 260-265 by corresponding word lines WLN0, WLP0, WLN1, WLP1, WLN2, WLP2, to the sense amplifiers 270-272 by corresponding bit lines BLB0, BLB1, BLB2, and to VDD power rails and VSS power rails in manners similar to those described with respect to one or more of FIGS. 1 and 2A-2D. For example, memory cells 251-254 are coupled to the corresponding word lines, bit lines and power rails as correspondingly described with respect to memory cells 200A-200D. In other memory cells of the memory array 250, the electrical connections (or lack thereof) between the P-type semiconductor device and the corresponding VDD power rail, and between the N-type semiconductor device and the corresponding VSS power rail are illustrated by broken (dot-dot) lines, for example, as designated at 257, 258 in a memory cell 256. Each of the broken lines 257, 258 indicates that an electrical connection may exist, or may not, depending on the logic value, e.g., logic "1" or logic "0," stored in the corresponding P-type semiconductor device (e.g., transistor MP) or N-type semiconductor device (e.g., transistor MN), as described with respect to FIGS. 2A-2D.

The word line drivers 260-265 are components of a word line driving circuit corresponding to the word line driving circuit 103. In the example configuration in FIG. 2F, the word line drivers 260-265 are configured as inverters. In some embodiments, each inverter of the word line drivers 260-265 comprises one or more CFET devices. For example, each inverter comprises a P-type transistor and an N-type transistor correspondingly configured by P-type semiconductor devices and N-type semiconductor devices of the one or more CFET devices. Other word line driver configurations are within the scopes of various embodiments.

In some embodiments, each of the word line drivers 260-265 is configured to apply a corresponding access voltage WL[0]-WL[5] to the corresponding word line WLN0, WLP0, WLN1, WLP1, WLN2, WLP2, independently of the other word line drivers. As a result, in at least one embodiment, a read operation of a P-type semiconductor device in a memory cell MC is independent from a read operation of an N-type semiconductor device in the same memory cell MC, and vice versa. In one or more embodiments, a read operation of a P-type (or N-type) semiconductor device in a memory cell MC is independent from read operations of any N-type (or any P-type) semiconductor device in any memory cell MC. In the example configuration in FIG. 2F, the sense amplifiers 270-272 are single-ended sense amplifiers each electrically coupled to a bit line. The particular numbers of memory cells, bit lines, word lines, word line drivers and sense amplifiers in FIG. 2F are examples. Other numbers of memory cells, bit lines, word lines, word line drivers and/or sense amplifiers are within the scopes of various embodiments.

Figure 3A:
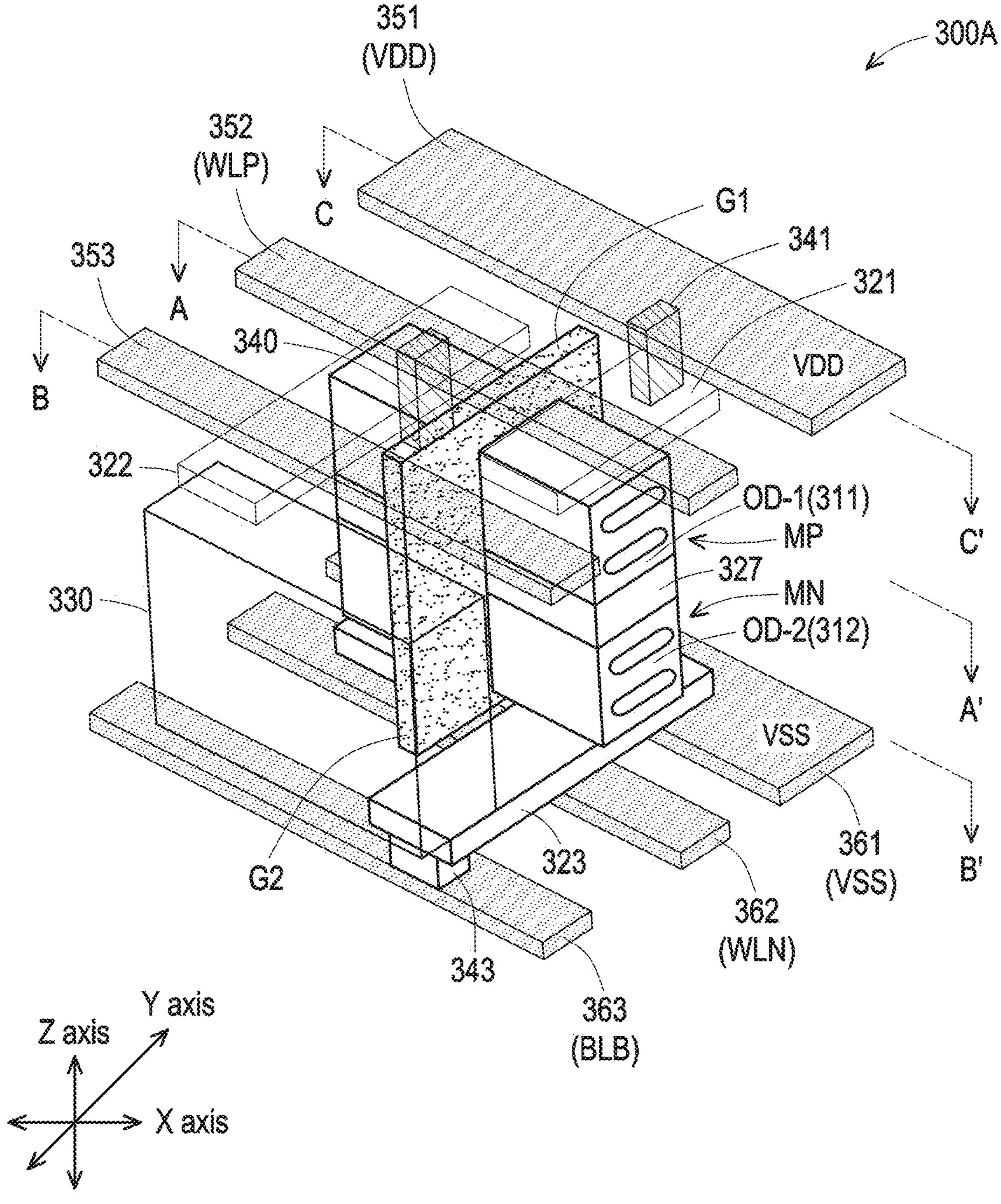
FIGS. 3A-3B are schematic perspective views of various CFET devices configured as memory cells, in accordance with some embodiments.

FIG. 3A is a schematic perspective view of a CFET device 300A configured as a memory cell, in accordance with some embodiments. In at least one embodiment, the CFET device 300A corresponds to one or more memory cells described with respect to FIGS. 1, 2A-4D, 2F. For simplicity, corresponding components in FIGS. 1, 2A-2F, 3A are designated by the same reference numerals.

A CFET device comprises a top semiconductor device over a bottom semiconductor device of a different semiconductor type from that of the top semiconductor device. In the CFET device 300A, the top semiconductor device is a P-type semiconductor device, i.e., transistor MP, and the bottom semiconductor device is an N-type semiconductor device, i.e., transistor MN. The CFET device 300A is an example of a P-type semiconductor device stacked on an N-type semiconductor device. This structure is sometimes referred to as a P-on-N structure. An example of a reversed, N-on-P structure in which an N-type semiconductor device is stacked on a P-type semiconductor device is described with respect to FIG. 3B.

Each of the transistor MP and transistor MN comprises an active region. Active regions are sometimes referred to as oxide-definition (OD) regions or source/drain regions, and are schematically illustrated in the drawings with labels including "OD." For example, the transistor MP comprises an active region OD-1, and the transistor MN comprises an active region OD-2. The active region OD-1 is stacked on the active region OD-2 along a thickness direction (or Z axis) of a substrate as described herein. The active regions OD-1, OD-2 are over a first side, or a front side, of the substrate as described herein. The active regions OD-1, OD-2 are elongated along an X axis which is an example of a first direction or a second direction. The active region OD-1, OD-2 include P-type dopants or N-type dopants to form one or more circuit elements or semiconductor devices. An active region configured to form one or more P-type semiconductor devices, e.g., P-channel metal-oxide semiconductor (PMOS) devices, is sometimes referred to as "PMOS active region," and an active region configured to form one or more N-type semiconductor devices, e.g., N-channel metal-oxide semiconductor (NMOS) devices, is sometimes referred to as "NMOS active region." In the example configuration described with respect to FIG. 3A, the active region OD-1 comprises a PMOS active region, and the active region OD-2 comprises a PMOS active region. The active regions OD-1, OD-2 are electrically isolated, and physically spaced along the Z axis, from each other by a dielectric layer 327.

The transistor MP further comprises a gate G1 which overlaps, or is stacked along the thickness direction of the substrate over, a corresponding gate G2 of the transistor MN. The gate G1 is electrically isolated from the gate G2. The gates G1, G2 are elongated along a Y axis which is an example of the second direction or the first direction. The gates G1, G2 comprise a conductive material, such as, polysilicon, metals, or the like.

Each of the active regions OD-1, OD-2 comprises a pair of source/drains on opposite sides of the corresponding gate G1, G2. One of the source/drains of the transistor MP, e.g., a source 311, is visible in FIG. 3A. One of the source/drains of the transistor MN, e.g., a drain 312, is visible in FIG. 3A. The other source/drains of the transistor MP and transistor MN are not numbered in FIG. 3A. The source/drains are described in further detail with respect to one or more of FIGS. 4A-4C.

The CFET device 300A further comprises source/drain contacts in electrical contact with corresponding source/drains in the active regions OD-1, OD-2. Source/drain contacts are sometimes referred to as metal-to-device (MD) contacts, and are schematically designated in the drawings with labels including "MD." Source/drain contacts of a top semiconductor device are sometimes referred to as MD contacts. Source/drain contacts of a bottom semiconductor device are sometimes referred to as BMD contacts. For simplicity, an MD contact herein refers to either an MD contact for the top semiconductor device or a BMD contact for the bottom semiconductor device, unless specified otherwise. An MD contact includes a conductive material in electrical contact with a corresponding source/drain in the corresponding active region to define an electrical connection from the source/drain to a further conductive structure or circuitry of a memory device, an IC device including the memory device, or to outside circuitry. MD contacts are arranged alternatingly with gates along the X axis. In the example configuration in FIG. 3A, MD contacts 321, 322 are over and in electrical contact with the corresponding source/drains of the transistor MP, and a BMD contact 323 is under and in electrical contact with one source/drain (e.g., the drain) of the transistor MN. Another BMD contact (not numbered) is under and in electrical contact with the other source/drain (e.g., the source) of the transistor MN. The MD contacts and BMD contacts are described in further detail with respect to one or more of FIGS. 4A-4C.

The CFET device 300A further comprises a vertical local interconnect (VLI) 330 which is a conductive structure physically located between and electrically coupling the MD contact 322 with the BMD contact 323. In at least one embodiment, the VLI 330, as a local interconnect, electrically couples conductive features or elements of the CFET device 300A, and does not electrically couple a conductive feature or element of the CFET device 300A directly with a conductive feature or element outside the CFET device 300A.

Over the top semiconductor device, i.e., over the transistor MP, the CFET device 300A further comprises vias over and in electrical contact with the gate and MD contacts of the transistor MP. A via over and in electrical contact with an MD contact is sometimes referred to as via-to-device (VD) via. A via over and in electrical contact with a gate is sometimes referred to as via-to-gate (VG) via. VD and VG vias are schematically illustrated in the drawings with the corresponding labels including "VD" and "VG." In the example configuration in FIG. 3A, a VG via 340 is over and in electrical contact with the gate G1, and a VD via 341 is over and in electrical contact with the MD contact 321.

Similarly, under the bottom semiconductor device, i.e., under the transistor MN, the CFET device 300A comprises back side VG and/or VD vias in electrical contact correspondingly with the gate and BMD contacts of the transistor MN. Back side VD and VG vias are schematically illustrated in the drawings with the corresponding labels including "BVD" and "BVG." In the example configuration in FIG. 3A, a BVD via 343 is under and in electrical contact with the BMD contact 323. The CFET device 300A further comprises a BVG via (not shown) and another BVD via (not shown) correspondingly under and in electrical contact with the gate G2 and the BMD contact (not numbered) under and in electrical contact with the source (not numbered) of the transistor MN. An example material of VD, VG, BVD, BVG vias includes metal. Other configurations are within the scopes of various embodiments. The VD, VG, BVD, BVG vias are described in further detail with respect to one or more of FIGS. 4A-4C.

A plurality of metal layers and via layers are sequentially and alternatingly arranged over the VD, VG vias. The lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like.

Similarly, a plurality of back side metal layers and a plurality of back side via layers are arranged sequentially and alternatingly under the BVD, BVG vias. The back side metal layer closest to the active region OD-2 is a back side M0 (BM0) layer, a next back side metal layer is a back side M1 (BM1) layer, or the like. A back side via layer BVn is arranged between and electrically couples the BMn layer and the BMn+1 layer, where n is an integer from zero and up. For example, a via layer BV0 is the back side via layer arranged between and electrically couples the BM0 layer and the BM1 layer. Other back side via layers are BV1, BV2, or the like.

In the example configuration in FIG. 3A, the M0 layer comprises M0 conductive patterns 351, 352, 353, and the BM0 layer comprises BM0 conductive patterns 361, 362, 363. The M0 conductive pattern 351 is over and in electrical contact with the VD via 341. The M0 conductive pattern 352 is over and in electrical contact with the VG via 340. In some embodiments, the M0 conductive pattern 353 is omitted. The BM0 conductive pattern 361 is under and in electrical contact with the BVD via which is under and in electrical contact with the source of the transistor MN. The BM0 conductive pattern 362 is under and in electrical contact with the BVG via which is under and in electrical contact with the gate of the transistor MN. The BM0 conductive pattern 363 is under and in electrical contact with the BVD via 343.

The M0 conductive pattern 351 is configured as a VDD power rail, and is electrically coupled to the source of the transistor MP through the VD via 341 and MD contact 321. In some embodiments, the M0 conductive pattern 351, sometimes referred to as VDD power rail 351, corresponds to one or more VDD power rails described with respect to FIGS. 2A-2D, 2F. The VDD power rail 351 is on the front side of the substrate as described herein, and is sometimes referred to as a front side word line.

The BM0 conductive pattern 361 is configured as a VSS power rail, and is electrically coupled to the source of the transistor MN through the corresponding BVD via and BMD contact, as described herein. In some embodiments, the BM0 conductive pattern 361, sometimes referred to as VSS power rail 361, corresponds to one or more VSS power rails described with respect to FIGS. 2A-2D, 2F. The VSS power rail 361 is on the back side of the substrate as described herein, and is sometimes referred to as a back side word line.

The M0 conductive pattern 352 is configured as a word line WLP, and is electrically coupled to the gate G1 of the transistor MP through the VG via 340. In some embodiments, the M0 conductive pattern 352, sometimes referred to as word line WLP 352, corresponds to one or more word lines WLP described with respect to FIGS. 2A-2D, 2F. The word line WLP 352 is on the front side of the substrate as described herein, and is sometimes referred to as a front side word line.

The BM0 conductive pattern 362 is configured as a word line WLN, and is electrically coupled to the gate G2 of the transistor MN through the corresponding BVG via, as described herein. In some embodiments, the BM0 conductive pattern 362, sometimes referred to as word line WLN 362, corresponds to one or more word lines WLN described with respect to FIGS. 2A-2D, 2F. The word line WLN 362 is on the back side of the substrate as described herein, and is sometimes referred to as a back side word line.

The BM0 conductive pattern 363 is configured as a bit line BLB, and is electrically coupled to the drain of the transistor MN through the BVD via 343 and BMD contact 323. The BM0 conductive pattern 363 is also electrically coupled to the drain of the transistor MP through the BVD via 343, VLI 330, and MD contact 322. In some embodiments, the BM0 conductive pattern 363, sometimes referred to as bit line BLB 363, corresponds to one or more bit lines BLB described with respect to FIGS. 2A-2D, 2F. The bit line BLB 363 is on the back side of the substrate as described herein, and is sometimes referred to as a back side bit line. In some embodiments, the M0 conductive pattern 353 is configured as a bit line BLB in place of the BM0 conductive pattern 363. For example, the BVD via 343 is omitted and replaced with a VD via electrically coupling the MD contact 322 to the M0 conductive pattern 353.

In some embodiments, one or more or all of the VDD power rail 351, word line WLP 352, VSS power rail 361, word line WLN 362 extend continuously along the X axis across multiple CFET devices or memory cells in a memory row of a memory array in a ROM device. In at least one embodiment, a BM1 conductive pattern (not shown) extends continuously along the Y axis across multiple CFET devices or memory cells in a memory column of the memory array. The BM1 conductive pattern is configured as a bit line BLB and is electrically coupled to the BM0 conductive pattern 363 by a BV0 via (not shown). Other configurations are within the scopes of various embodiments. For example, in one or more embodiments, the bit line BLB 363 extends continuously along the X axis across multiple CFET devices or memory cells in a memory column of the memory array, whereas a word line WLP and a word line WLN are correspondingly provided as an M1 conductive pattern and a BM1 conductive pattern, which extend continuously along the Y axis across multiple CFET devices or memory cells in a memory row of the memory array and are electrically coupled to the corresponding M0 conductive pattern 352 and BM0 conductive pattern 362 correspondingly through a V0 via and a BV0 via.

In some embodiments, the described electrical connections of the gate G1 to the word line WLP 352, the gate G2 to the word line WLN 362, the source of the transistor MP to the VDD power rail 351, the source of the transistor MN to the VSS power rail 361, and the drains of the transistors MP, MN to the bit line BLB are present in all CFET devices configured as memory cells in a ROM device. The transistor MP or transistor MN of each CFET device is configured to store logic "1" or logic "0" by the presence or absence of a corresponding VD via or BVD via electrically coupling the source of the transistor MP or transistor MN to the corresponding VDD power rail 351 or VSS power rail 361.

In the example configuration in FIG. 3A, the VD via 341 exists and electrically couples the source of the transistor MP to the VDD power rail 351. As result, the transistor MP is configured to store logic "0," as described with respect to FIGS. 2C, 2D. In one or more embodiments, the VD via 341 is omitted, i.e., the source of the transistor MP is electrically disconnected from the VDD power rail 351. As result, the transistor MP is configured to store logic "1," as described with respect to FIGS. 2A, 2B.

In some embodiments, a BVD via exists and electrically couples the source of the transistor MN to the VSS power rail 361. As result, the transistor MN is configured to store logic "1," as described with respect to FIGS. 2A, 2C. In one or more embodiments, such a BVD via is omitted, i.e., the source of the transistor MN is electrically disconnected from the VSS power rail 361. As result, the transistor MN is configured to store logic "0," as described with respect to FIGS. 2B, 2D.

In some embodiments, a layout diagram of a memory array in a ROM device is generated, e.g., by an EDA tool or system comprising at least one hardware processor. The layout diagram comprises layouts of multiple CFET devices corresponding to the CFET device 300A or 300B which are arranged in rows and columns of the memory array. The layouts of the CFET devices are identical to each other, except for the presence or absence of a VD via (corresponding to the VD via 341) between the source of the top semiconductor device and a corresponding power rail, and/or the presence or absence of a BVD via between the source of the bottom semiconductor device and a corresponding back side power rail. The EDA tool or system is configured to generate, or "drop," VD vias and BVD vias in the layout diagram of the memory array, based on the data (i.e., a set of various logic "1" and logic "0") to be stored in the ROM device. For example, a VD via is dropped where the transistor MP of a CFET device is configured to store logic "0," a VD via is not dropped where the transistor MP of a CFET device is configured to store logic "1," a BVD via is dropped where the transistor MN of a CFET device is configured to store logic "1," and a BVD via is not dropped where the transistor MN of a CFET device is configured to store logic "0." Based on the VD vias and BVD vias dropped in the layout diagram of the memory array, corresponding masks are fabricated and used for manufacturing corresponding ROM devices, e.g., by an IC manufacturing system. The described process is an example. Other design or manufacturing processes are within the scopes of various embodiments.

As described herein, in some embodiments, a CFET device in a ROM device is configured to store two bits of data, each being independent from the other. Because one of the semiconductor devices in a CFET device is stacked on the other, this configuration, in one or more embodiments, provides a high density ROM device with about 50% improvement in bit cell area and/or density scaling, at the same technology node or feature size. This is an advantage over other approaches in which ROM devices do not use CFET devices for storing data. In the other approaches, ROM bit cell area and/or density scaling strongly depend(s) on technology shrink (e.g., by reducing the gate pitch and/or fin pitch). However, area and/or density scaling slow(s) down in advanced technology nodes. In at least one embodiment, without requiring further technology shrink, it is possible to configure the same chip area to store about twice the amount of data, or to store the same amount of data in about 50% chip area, by using CFET devices to store data in ROM devices. In at least one embodiment, this improvement is particularly beneficial at advanced technology nodes.

Figure 3B:
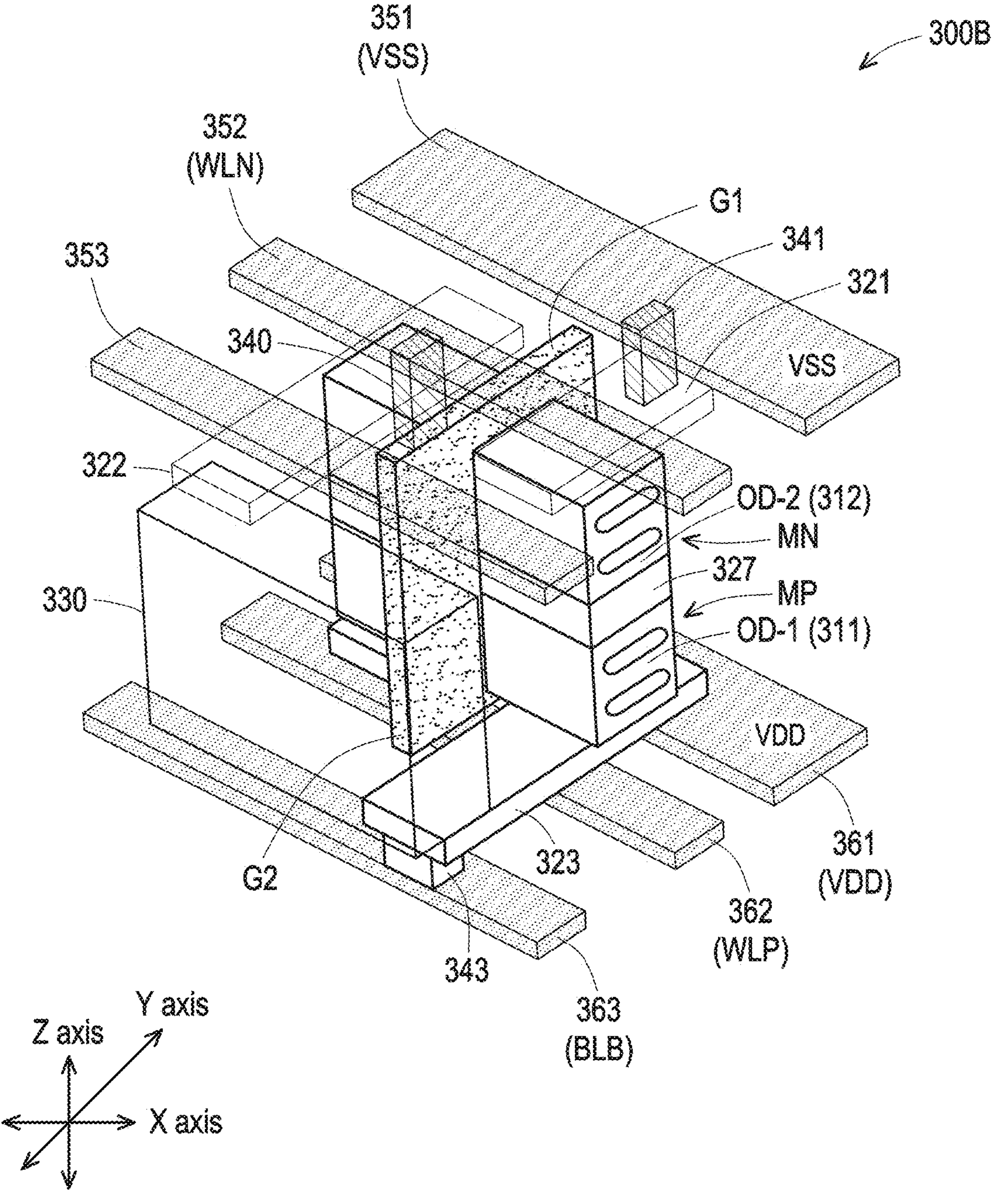

FIG. 3B is a schematic perspective view of a CFET device 300B configured as a memory cell, in accordance with some embodiments. In at least one embodiment, the CFET device 300B corresponds to one or more memory cells described with respect to FIGS. 1, 2A-4D, 2F. For simplicity, corresponding components in FIGS. 1, 2A-2F, 3A-3B are designated by the same reference numerals.

As described herein, a difference between the CFET device 300A and CFET device 300B is that the CFET device 300A is a P-on-N structure, whereas the CFET device 300B is an N-on-P structure. In the CFET device 300B, the M0 conductive patterns 351, 352 and the BM0 conductive patterns 361, 362 are correspondingly configured as a VSS power rail, a word line WLN, a VDD power rail, a word line WLP. The BM0 conductive pattern 363 is configured as a bit line BLB, similarly to the CFET device 300A. The CFET device 300B is configured to store two bits of data independently in the transistor MN and transistor MP, as described herein. In at least one embodiment, one or more advantages described herein are achievable by the CFET device 300B, and/or by a ROM device including the CFET device 300B.

Figure 4A:
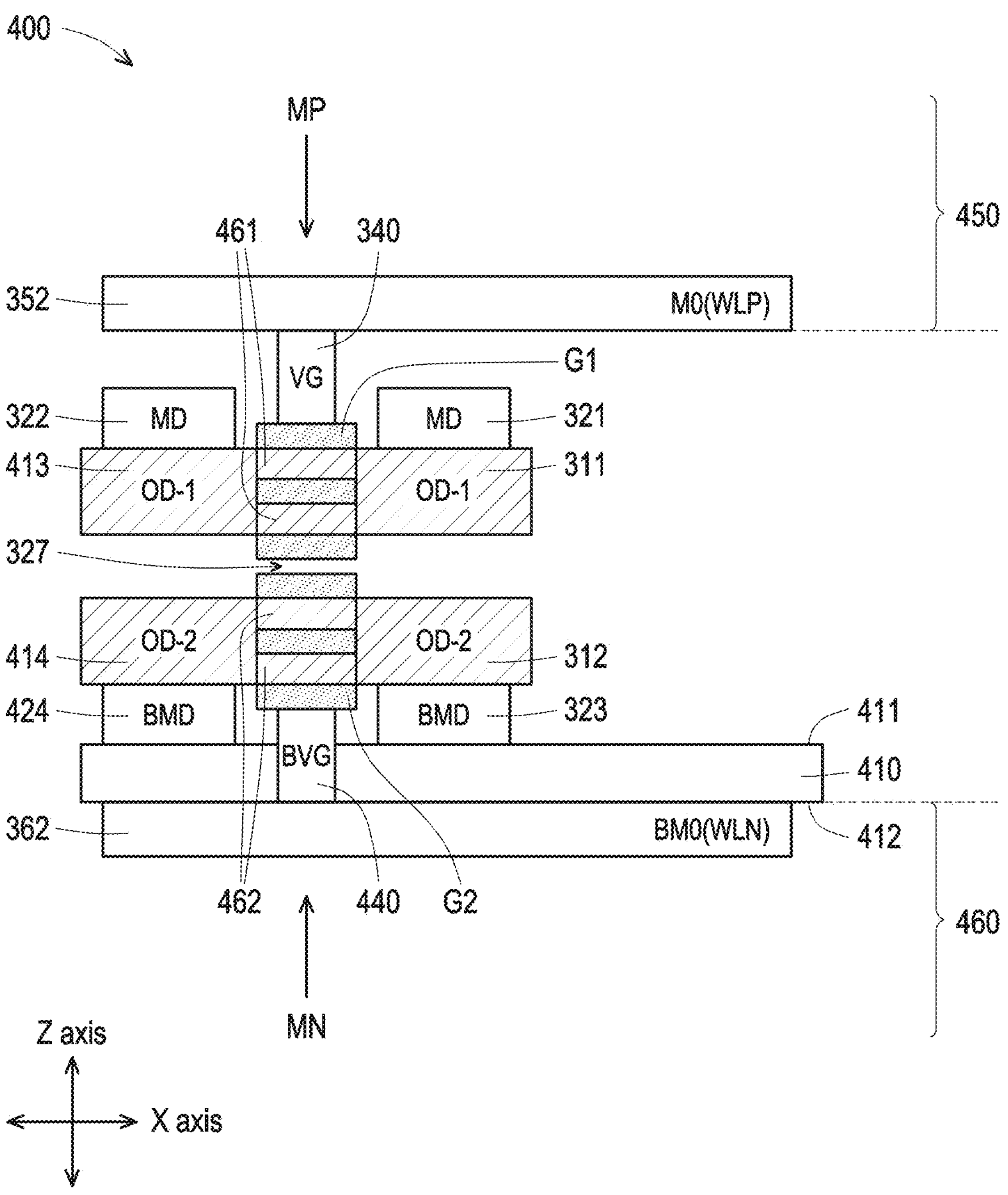
FIGS. 4A-4C are schematic cross-sectional views of a portion of a memory device, in accordance with some embodiments.
Figure 4B:
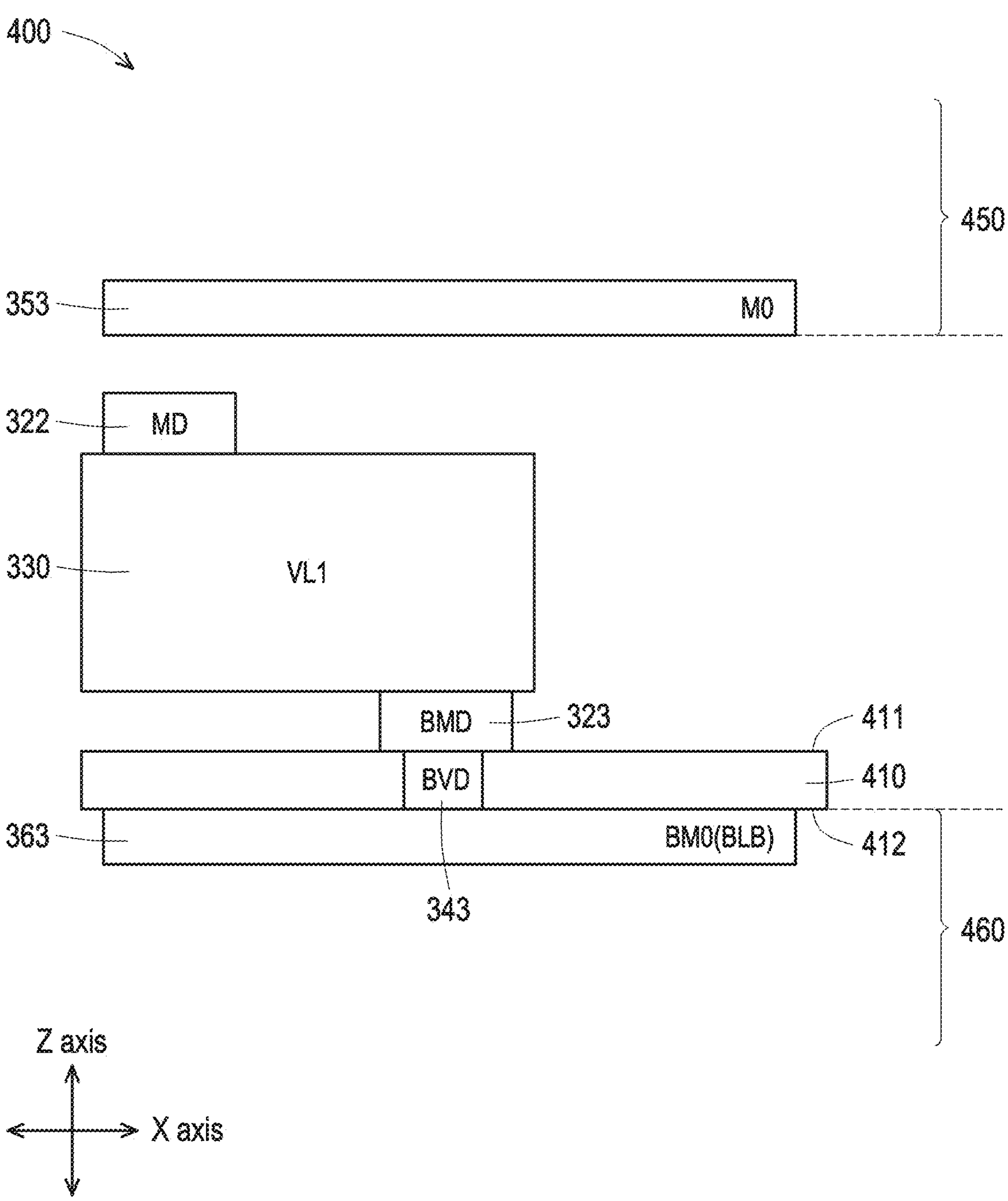
Figure 4C:
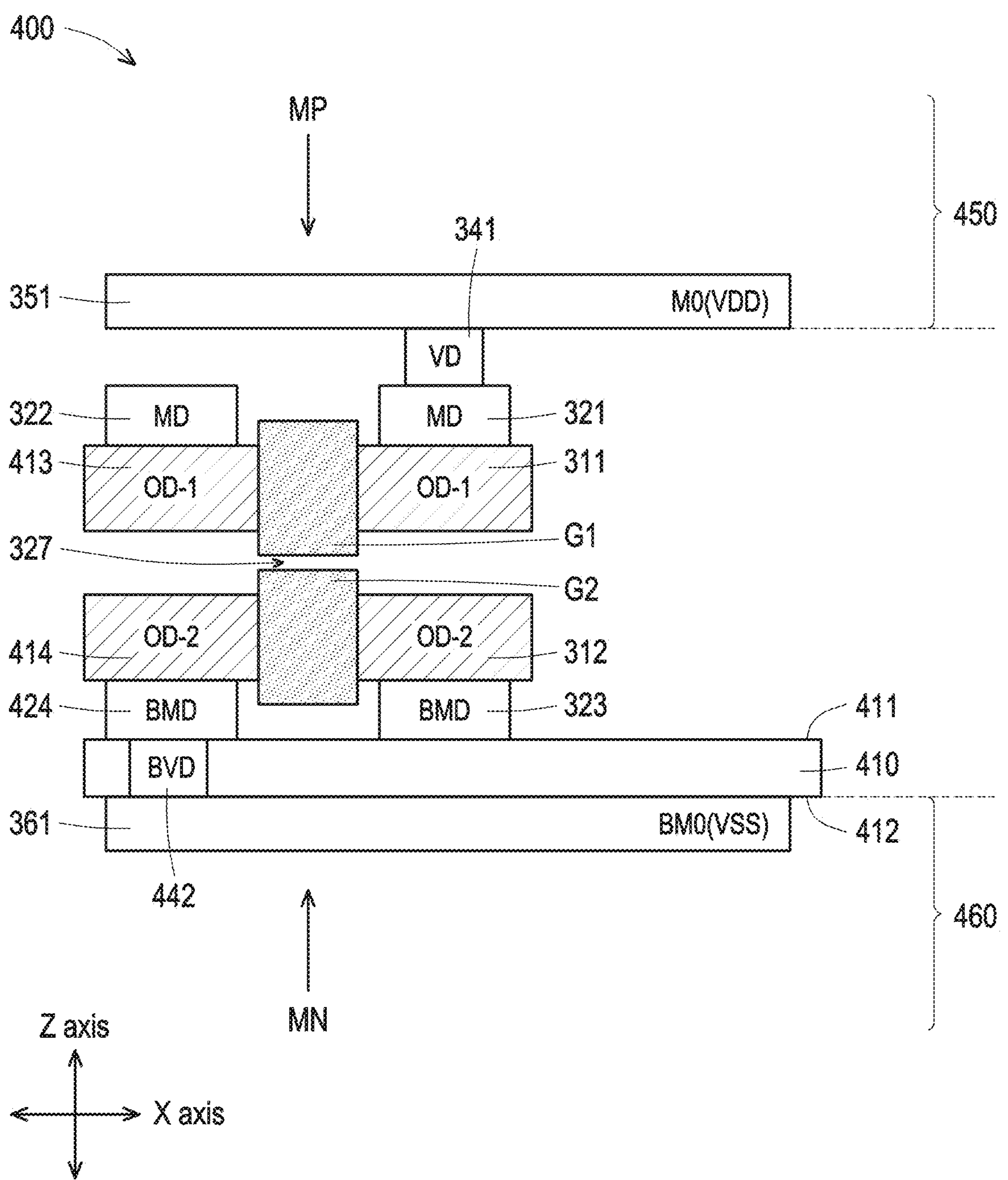

FIGS. 4A-4C are schematic cross-sectional views of a portion of a memory device 400, in accordance with some embodiments. The portion of the memory device 400 in FIGS. 4A-4C corresponds to the CFET device 300A. The views in FIGS. 4A-4C correspond to cross-sectional views taken along lines A-A', B-B', and C-C' in FIG. 3A. For simplicity, corresponding components in FIGS. 3A-3B and 4A-4C are designated by the same reference numerals.

As illustrated in FIG. 4A, the memory device 400 comprises a substrate 410 having a front side 411, and a back side 412 opposite to the front side 411 in a thickness direction of the substrate 410. In at least one embodiment, the front side 411 is referred to as "first side," "upper side" or "device side," whereas the back side 412 is referred to as "second side," or "lower side." The thickness direction of the substrate 410 is also a thickness direction of the memory device 400, and is designated as the Z axis in the drawings. In some embodiments, the substrate 410 comprises a semiconductor material, such as silicon, silicon germanium (SiGe), gallium arsenic, or other suitable semiconductor materials. In some embodiments, the substrate 410 comprises a dielectric material, such as silicon nitride, silicon oxide, ceramic, glass, or other suitable materials. In some embodiments, the substrate 410 comprises a multi-layer structure. In some embodiments, the substrate 410 is omitted, or comprises an insulation layer that replaces an initial semiconductor bulk used during manufacture.

The memory device 400 further comprises, over the front side 411 of the substrate 410, a CFET device corresponding to the CFET device 300A with the corresponding transistors MP, MN described with respect to FIG. 3A. Each of the transistors MP, MN comprises a channel which is arranged in the corresponding active region. In the example configuration in FIG. 4A, the channel of transistor MP comprises a semiconductor material, such as Si, in the corresponding active region OD-1, and is configured as a plurality of N-type nanosheets 461 stacked over, while being spaced from, each other in the thickness direction. Similarly, the channel of transistor MN comprises a semiconductor material, such as Si, in the corresponding active region OD-2, and is configured as a plurality of P-type nanosheets 462 stacked over, while being spaced from, each other in the thickness direction. The described channel material and nanosheets are examples. Other channel materials and/or channel types, such as nanowire, FinFET, planar, or the like, are within the scopes of various embodiments.

In the example configuration in FIG. 4A, the gates G1, G2 of the transistors MP, MN are all-around gates which extend around the corresponding channels. In some embodiments, the gate material, e.g., a metal, of the gates G1, G2 replaces a sacrificial material, such as SiGe, in the corresponding active region during a manufacturing process. The gates G1, G2 are electrically isolated, and physically spaced along the Z axis, from each other by a dielectric layer 327.

Each of the transistors MP, MN further comprises a gate dielectric (not shown) between the corresponding gate and channel. For example, in the transistor MP, a gate dielectric is between the gate G1 and nanosheets 461, and extends around each of the nanosheets 461. In the transistor MN, a gate dielectric is between the gate G2 and nanosheets 462, and extends around each of the nanosheets 462. Example materials of the gate dielectric include high-k dielectric materials, or the like.

Each of the transistors MP, MN further comprises source/drains in the corresponding active region. For example, the transistor MP comprises the source 311 and a drain 413 in the active region OD-1, and the transistor MN comprises a source 414 and the drain 312 in the active region OD-2. In some embodiments, a source/drain comprises an epitaxy structure coupled to the adjacent nanosheets. For example, the source/drains 311, 413 are coupled to the nanosheets 461, and the source/drains 312, 414 are coupled to the nanosheets 462. In some embodiments, source/drains are grown by epitaxy processes.

As can be seen in FIG. 4A, the memory device 400 further comprises MD contacts 321, 322 and VG via 340 on the front side 411. The memory device 400 further comprises BMD contacts 323, 424, and a BVG via 440 on the back side 412. As described with respect to FIG. 3A, the MD contact 322 is over and in electrical contact with the drain 413, the BMD contact 424 is under and in electrical contact with the source 414, and the BVG via 440 is under and in electrical contact with the gate G2.

The memory device 400 further comprises a front side redistribution structure 450, and back side redistribution structure 460. The front side redistribution structure 450 is on the front side, over the VD, VG vias, and comprises various metal layers M0, M1, or the like, and via layers V0, V1 or the like, as described herein. The back side redistribution structure 460 is on the back side, under the BVD, BVG vias, and comprises various back side metal layers BM0, BM1, or the like, and back side via layers BV0, BV1 or the like, as described herein. In the example configuration in FIG. 4A, the BVG via 440 extends through the substrate 410 from the back side 412 to the front side 411, to come in physical and electrical contact with the gate G2. The word line WLN 362 in the BM0 layer is on the back side 412 of the substrate 410, and is in physical and electrical contact with the BVG via 440. For simplicity, various metal layers and via layers in the front side redistribution structure 450 and back side redistribution structure 460 are omitted.

As illustrated in FIG. 4B, the BVD via 343 extends through the substrate 410 from the back side 412 to the front side 411. The memory device 400 further comprises the VLI 330 which is in physical and electrical contact with the MD contact 322 on the upper or top side, and with the BMD contact 323 on the lower or bottom side. The drain 413 (in FIG. 4A) of the transistor MP is electrically coupled by the MD contact 322, VLI 330, BMD contact 323, BVD via 343 to the bit line BLB 363. The drain 312 (in FIG. 4A) of the transistor MN is electrically coupled by the BMD contact 323, VLI 330, MD contact 322 to the drain 413 of the transistor MP, and by the BVD via 343 to the bit line BLB 363. In some embodiments, the BVD via 343 is omitted and replaced by a VD via electrically coupling the MD contact 322 to the M0 conductive pattern 353 which is configured as a bit line BLB in place of the BM0 conductive pattern 363.

As illustrated in FIG. 4C, the memory device 400 further comprises a BVD via 442 which extends through the substrate 410 from the back side 412 to the front side 411. The BVD via 442, through the BMD contact 424, electrically couples the source 414 of the transistor MN to the VSS power rail 361. On the front side, the VD via 341, through the MD contact 321, electrically couples the source 311 of the transistor MP to the VDD power rail 351.

In some embodiments, the cross-section views in FIGS. 4A-4B are similar for various CFET devices in a memory array of the memory device 400. The cross-section view in FIG. 4C varies among the CFET devices of the memory array, by the presence or absence of the VD via 341 and/or BVD via 442. In the example configuration in FIG. 4C, both VD via 341 and BVD via 442 are present, resulting in the data PN of "01" being stored in the CFET device, as described with respect to FIG. 2C. In another example, both VD via 341 and BVD via 442 are absent, resulting in the data PN of "10" being stored in the CFET device, as described with respect to FIG. 2B. In a further example, VD via 341 is present and BVD via 442 is absent, resulting in the data PN of "00" being stored in the CFET device, as described with respect to FIG. 2D. In yet another example, VD via 341 is absent and BVD via 442 is present, resulting in the data PN of "11" being stored in the CFET device, as described with respect to FIG. 2A. In at least one embodiment, one or more advantages described herein are achievable by the memory device 400.

Figure 5A:
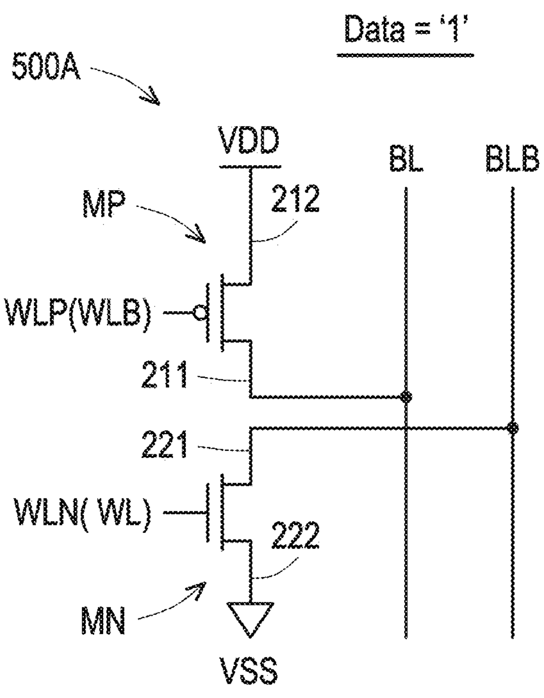
FIGS. 5A-5B are schematic circuit diagrams of various memory cells, in accordance with some embodiments.
Figure 5B:
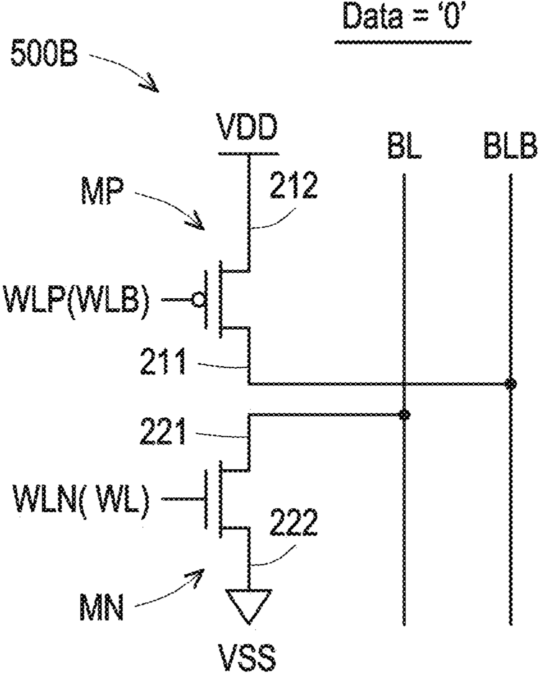

FIGS. 5A, 5B are schematic circuit diagrams of various memory cells 500A, 500B, in accordance with some embodiments. In some embodiments, each of the memory cells 500A, 500B corresponds to one or more memory cells MC in the memory device 100. As described herein, the memory cells 500A, 500B differ from each other by data stored therein. For simplicity, corresponding components in FIGS. 2A-2D and 5A-5B are designated by the same reference numerals.

Compared to the memory cells 200A-200D in which the P-type semiconductor device and N-type semiconductor device are configured to independently store two bits of data (or two logic values) each in one of the semiconductor devices, in the memory cells 500A, 500B, the P-type semiconductor device and the N-type semiconductor device are configured to together store a bit of data (or a logic value).

In FIG. 5A, the memory cell 500A comprises a CFET device with a transistor MP and a transistor MN as described herein. The circuit arrangement of the transistor MP and transistor MN in FIG. 5A does not necessarily correspond to the physical arrangement of the transistors in the CFET device. In some embodiments, the transistor MP is physically over the transistor MN. In some further embodiments, the transistor MN is physically over the transistor MN. The transistor MP comprises a first source/drain 211, a second source/drain 212, and a gate (not numbered). The transistor MN comprises a first source/drain 221, a second source/drain 222, and a gate (not numbered).

A word line WLP is electrically coupled to the gate of the transistor MP, and a corresponding word line WLN is electrically coupled to the gate of the transistor MN. In some embodiments, the word line WLP corresponds to one or more of the word lines WLP0, WLP1 to WLPm, and the word line WLN corresponds to one or more of the word lines WLN0, WLN1 to WLNm, described with respect to FIG. 1. Compared to the memory cells 200A-200D where the word lines WLP, WLN are configured to receive access voltages (or address signals) which are independent from each other, the word lines WLP, WLN in the memory cell 500A are configured to receive related, or corresponding, access voltages (or address signals). In the example configuration in FIG. 5A, the word lines WLP, WLN are configured as a pair of word lines WLB, WL one of which, e.g., word line WLB, is configured to receive an access voltage being the inverted signal of an access voltage applied to the other word line, e.g., word line WL. Other configurations are within the scopes of various embodiments.

A VDD power rail is electrically coupled to the second source/drain 212 of the transistor MP, and a VSS power rail is electrically coupled to the second source/drain 222 of the transistor MN.

A pair of differential bit lines BL, BLB is electrically coupled to the first source/drain 211 of the transistor MP and the first source/drain 221 of the transistor MN. Specifically, the first source/drain 211 of the transistor MP is electrically coupled to one of the pair of differential bit lines BL, BLB, whereas the first source/drain 221 of the transistor MN is electrically coupled to the other of the pair of differential bit lines BL, BLB. In some embodiments, the bit line BL corresponds to one or more of the bit lines BL0, BL1 to BLk, and/or the bit line BLB corresponds to one or more of the bit lines BLB0, BLB1 to BLBk, described with respect to FIG. 1.

The electrical connections between the pair of differential bit lines BL, BLB and the first source/drains of the transistors MP, MN define a logic value stored together by the transistors MP, MN.

In FIG. 5A, the bit line BL is electrically coupled to the first source/drain 211 of the transistor MP and the bit line BLB is electrically coupled to the first source/drain 221 of the transistor MN. This arrangement corresponds to a first logic value, e.g., logic "1," stored together by the transistors MP, MN.

In FIG. 5B, the memory cell 500B comprises a reversed arrangement in which the bit line BLB is electrically coupled to the first source/drain 211 of the transistor MP and the bit line BL is electrically coupled to the first source/drain 221 of the transistor MN. This reversed arrangement corresponds to a second logic value, e.g., logic "0," stored together by the transistors MP, MN.

Figure 5C:
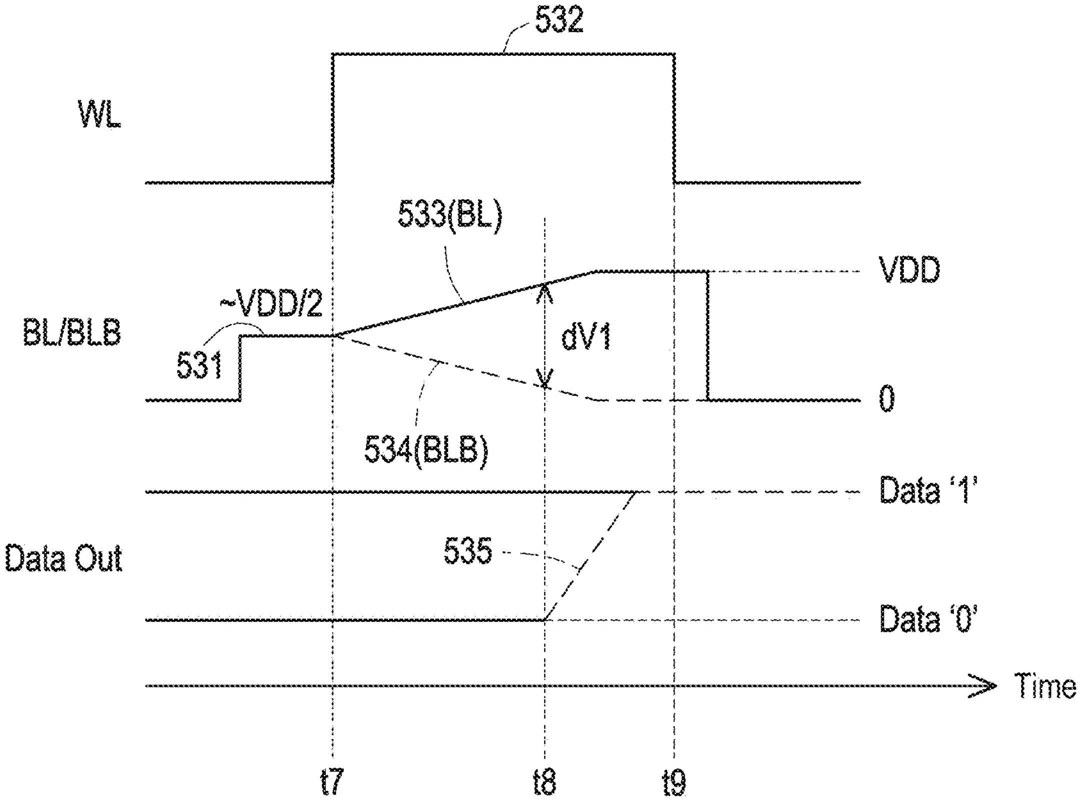
FIGS. 5C-5D are timing diagrams showing read operations of various memory cells, in accordance with some embodiments.
Figure 5D:
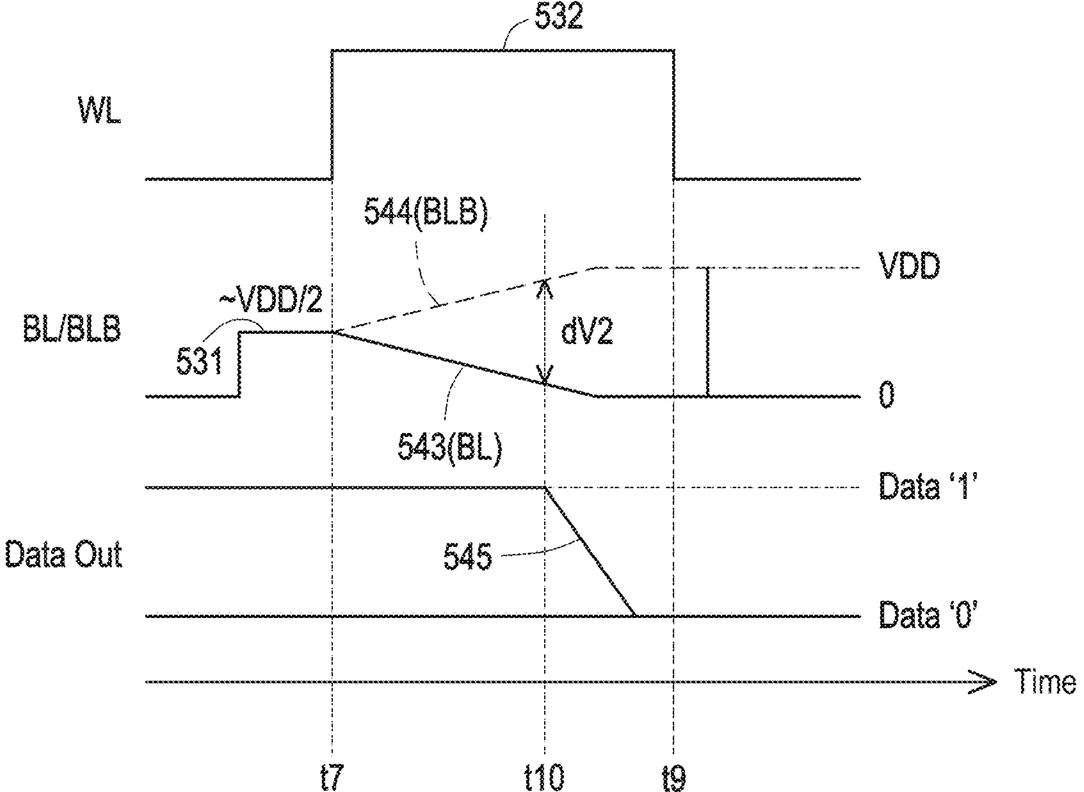

FIGS. 5C, 5D are timing diagrams correspondingly showing read operations of the memory cells 500A, 500B, in accordance with some embodiments. The timing diagrams in FIG. 5C, 5D show voltages on the word line WL, the pair of differential bit lines BL, BLB, and at an output (Data Out) of a sense amplifier coupled to the differential bit lines BL, BLB. The voltage on the bit line BLB is shown by broken (dot-dot) lines. The voltage on the bit line BL is shown by solid lines.

FIG. 5C shows a read operation of the memory cell 500A. Before accessing the transistors MP, MN of the memory cell 500A, the differential bit lines BL, BLB are pre-charged by a pre-charging circuit, as described with respect to FIG. 1, to a pre-charge voltage 531. In the example configuration in FIG. 5C, the pre-charge voltage 531 is about a half of VDD. Other pre-charge voltages between VDD and zero are within the scopes of various embodiments. An example pre-charging circuit comprises a pull-up circuit, such as a P-type transistor coupled between a node or rail of VDD/2 and the differential bit lines BL, BLB. Other pre-charging circuit configurations and/or positive power supply voltages other than VDD are within the scopes of various embodiments.

When the differential bit lines BL, BLB have been pre-charged, a memory controller corresponding to the memory controller 102 is configured to supply an access voltage 532 to the word line WL (i.e., WLN) coupled to the gate of the transistor MN, and an inverted signal of the access voltage 532 to the word line WLB (i.e., WLP) coupled to the gate of the transistor MP.

At timing t7 corresponding to a rising edge of the access voltage 532, the access voltage 532 on the word line WL turns ON the transistor MN, whereas the inverted signal of the access voltage 532 on the word line WLB turns ON the transistor MP. The read operations of the memory cells 500A, 500B are similar to each other up to this point.

In the memory cell 500A, because the first source/drain 211 of the transistor MP is electrically coupled to the bit line BL, the turned ON transistor MP electrically couples the VDD power rail to the bit line BL. As a result, the voltage on the bit line BL increases from the pre-charge voltage 531, as indicated at 533. Further, because the first source/drain 221 of the transistor MN is electrically coupled to the bit line BLB, the turned ON transistor MN electrically couples the VSS power rail to the bit line BLB. As a result, the voltage on the bit line BLB decreases from the pre-charge voltage 531, as indicated at 534.

At timing t8, a voltage difference dV1 between the voltages on the differential bit lines BL, BLB reaches a level sufficient to be detected by a sense amplifier included in the memory controller and coupled to the differential bit lines BL, BLB. In at least one embodiment, the sense amplifier corresponds to the sense amplifier 105. An example sense amplifier comprises a double-ended sense amplifier which is configured to compare the voltages on the differential bit lines BL, BLB with each other. Specifically, at timing t8, the voltage difference dV1 between the voltages on the differential bit lines BL, BLB is sufficient to be detected by the sense amplifier, and causes a voltage at an output (Data Out) of the sense amplifier to switch. For example, the voltage at the output of the sense amplifier begins to rise from timing t8, as indicated at 535.

At timing t9, the memory controller stops applying the access voltage 532 and the corresponding inverted signal to the word lines WL, WLB. The voltage at the output of the sense amplifier reaches a high voltage level corresponding to logic "1." As a result, the logic value, i.e., logic "1," stored in the memory cell 500A is read out.

FIG. 5D shows a read operation of the memory cell 500B. In the memory cell 500B, because the first source/drain 211 of the transistor MP is electrically coupled to the bit line BLB, the turned ON transistor MP electrically couples the VDD power rail to the bit line BLB. As a result, the voltage on the bit line BLB increases from the pre-charge voltage 531, as indicated at 544. Further, because the first source/drain 221 of the transistor MN is electrically coupled to the bit line BL, the turned ON transistor MN electrically couples the VSS power rail to the bit line BL. As a result, the voltage on the bit line BL decreases from the pre-charge voltage 531, as indicated at 543.

At timing t10, a voltage difference dV2 between the voltages on the differential bit lines BL, BLB reaches a level sufficient to be detected by the sense amplifier. The voltage difference dV2 has a sign opposite to that of the voltage difference dV1. Specifically, at timing t10, the voltage difference dV2 between the voltages on the differential bit lines BL, BLB is sufficient to be detected by the sense amplifier, and causes a voltage at an output (Data Out) of the sense amplifier to switch. For example, the voltage at the output of the sense amplifier begins to fall from timing t10, as indicated at 545.

At timing t9, the memory controller stops applying the access voltage 532 and the corresponding inverted signal to the word lines WL, WLB. The voltage at the output of the sense amplifier reaches a low voltage level corresponding to logic "0." As a result, the logic value, i.e., logic "0," stored in the memory cell 500B is read out.

In other approaches in which ROM devices do not use CFET devices for storing data, a single-ended sensing scheme with a bit line full-swing is often implemented in a read operation. At advanced technology nodes with high density ROM devices, the channel width and/or metal width are reduced which, in turn, potentially lead to a small cell current on the bit line and/or large bit line loading (bit line parasitic capacitance). As a result, memory cells in ROM devices of the other approaches potentially have a long bit line discharge time which requires a bit line full-swing (or increased time) for the voltage on the bit line to reach a sufficient level detectable by a single-ended sense amplifier. The described long bit line discharge time and/or need for a bit line full-swing potentially result in a slow read speed which is a concern for ROM device in the other approaches.

In at least one embodiment, because both the transistors MP, MN are turned ON in a read operation with a double-end sensing scheme using differential bit lines, it is possible to quickly develop a sufficiently large voltage difference detectable by a double-end sense amplifier. In some embodiments, a bit line full swing is not required to obtain a detectable voltage difference. In at least one embodiment, the read speed is reduced to about 50% of the read speed in the other approaches. By configuring both semiconductor devices in a CFET device to store, together, a bit of data and/or using a double-ended sensing scheme, it is possible in one or more embodiments to obtain a high speed ROM device with about 50% speed improvement in bit line delay, compared to the other approaches. In at least one embodiment, this improvement is particularly beneficial at advanced technology nodes.

Figure 5E:
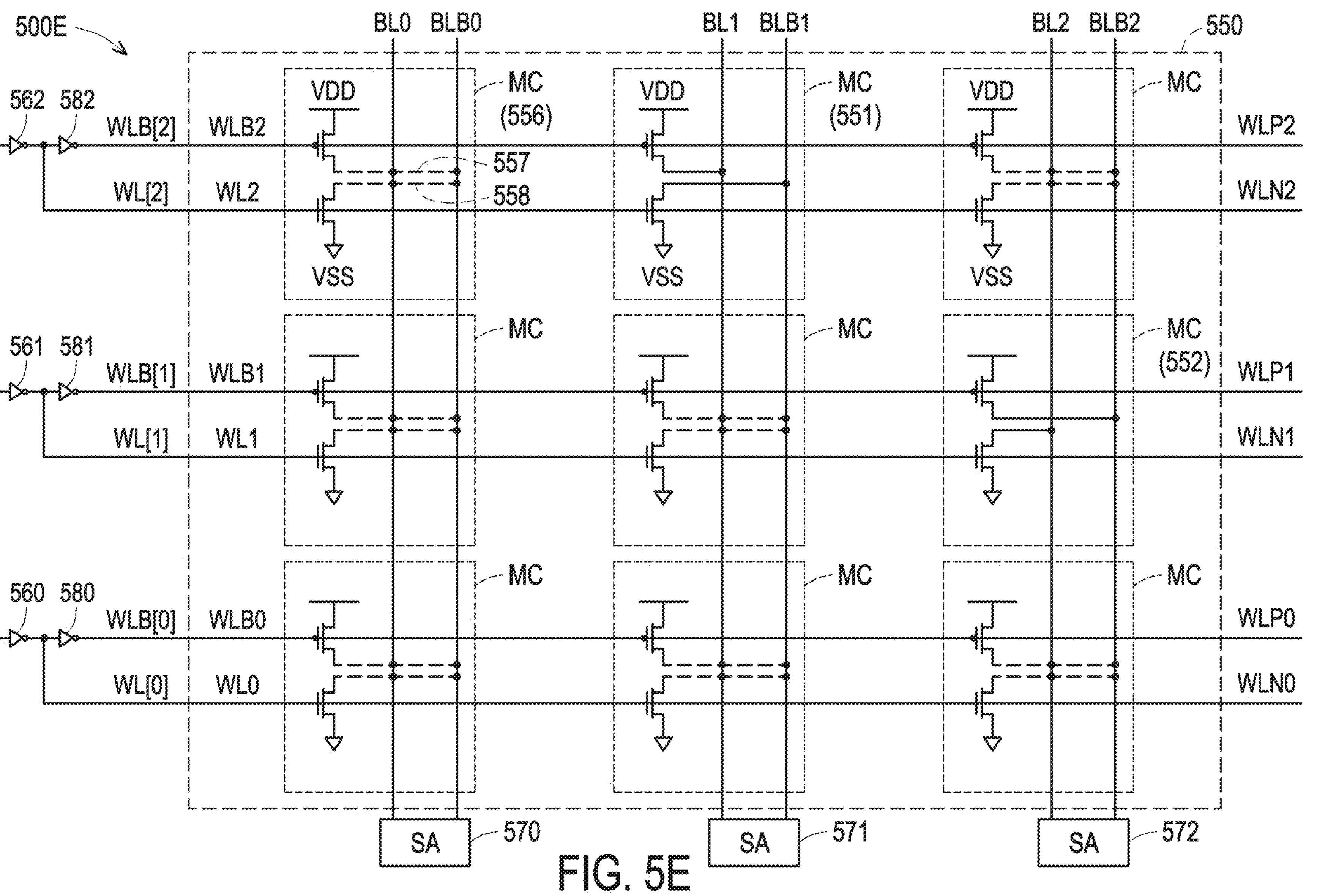
FIG. 5E is a schematic circuit diagram of a memory device, in accordance with some embodiments.

FIG. 5E is a schematic circuit diagram of a memory device 500E, in accordance with some embodiments. In some embodiments, the memory device 500E corresponds to the memory device 100, and includes components corresponding to those of the memory device 100. For simplicity, various components of the memory device 500E are omitted in FIG. 5E.

The memory device 500E comprises a memory array 550 of a plurality of memory cells MC, and a memory controller coupled to control an operation of the memory cells MC. The memory controller comprises word line drivers 560-562, sense amplifiers 570-572, and inverters 580-582. Other components of the memory controller are omitted for simplicity.

The word line drivers 560-562 and inverters 580-582 are components of a word line driving circuit corresponding to the word line driving circuit 103. In some embodiments, the word line drivers 560-562 are configured as inverters each comprising one or more CFET devices, as described herein. In at least one embodiment, each of the inverters 580-582 comprises a CFET device. Other word line driver and/or inverter configurations are within the scopes of various embodiments.

Each of the inverters 580-582 has an input electrically coupled to an output of a corresponding one of the word line drivers 560-562, and is configured to generate an inverted signal of an address signal (or access voltage) output by the corresponding word line driver. For example, the inverter 580 has an input electrically coupled to an output of the corresponding word line driver 560, and is configured to generate an inverted signal WLB[0] of an address signal WL[0] output by the word line driver 560. The outputs of the word line driver 560 and inverter 580 are electrically coupled to a pair of word lines WL0, WLB0 to supply a pair of the address signal WL[0] and inverted address signal WLB[0] correspondingly to the pair of word lines WL0, WLB0. Outputs of the word line driver 561 and inverter 581 are electrically coupled to a pair of word lines WL1, WLB1 to supply a pair of an address signal WL[1] and a corresponding inverted address signal WLB[1] correspondingly to the pair of word lines WL1, WLB1. Outputs of the word line driver 562 and inverter 582 are electrically coupled to a pair of word lines WL2, WLB2 to supply a pair of an address signal WL[2] and a corresponding inverted address signal WLB[2] correspondingly to the pair of word lines WL2, WLB2. The word lines WL0, WLB0, WL1, WLB1, WL2, WLB2 are configured correspondingly by the word lines WLN0, WLP0, WLN1, WLP1, WLN2, WLP2.

The memory cells MC are coupled to the word line drivers 560-562 by the word lines WL0, WLB0, WL1, WLB1, WL2, WLB2, to the sense amplifiers 570-572 by corresponding bit lines BL0, BLB0, BL1, BLB1, BL2, BLB2, and to VDD power rails and VSS power rails in manners similar to those described with respect to one or more of FIGS. 1, 5A, 5B. For example, memory cells 551, 552 are coupled to the corresponding word lines, bit lines and power rails as correspondingly described with respect to memory cells 500A, 500B. In other memory cells of the memory array 550, the electrical connections of a pair of differential bit lines BL, BLB to corresponding source/drains of the P-type and N-type semiconductor devices in a CFET device are illustrated by broken (dot-dot) lines, for example, as designated at 557, 558 in a memory cell 556. Each of the broken lines 557, 558 indicates that a source/drain of the corresponding P-type semiconductor device (e.g., transistor MP) or N-type semiconductor device (e.g., transistor MN) may be electrically coupled to the corresponding bit line BL0 or bit line BLB0, depending on the logic value, e.g., logic "1" or logic "0," stored in the CFET device, as described with respect to FIGS. 5A-5D.

In the example configuration in FIG. 5E, the sense amplifiers 570-572 are double-ended sense amplifiers each electrically coupled to a pair of differential bit lines. The particular numbers of memory cells, bit lines, word lines, word line drivers, inverters and sense amplifiers in FIG. 5E are examples. Other numbers of memory cells, bit lines, word lines, word line drivers, inverters and/or sense amplifiers are within the scopes of various embodiments. In at least one embodiment, one or more advantages described herein are achievable by the memory device 500E.

FIGS. 6A-6D are schematic perspective views of CFET devices 600A-600D configured as memory cells, in accordance with some embodiments. In at least one embodiment, one or more of the CFET devices 600A-600D correspond to one or more memory cells described with respect to FIGS. 1, 5A, 5B, 5E.

Figure 6A:
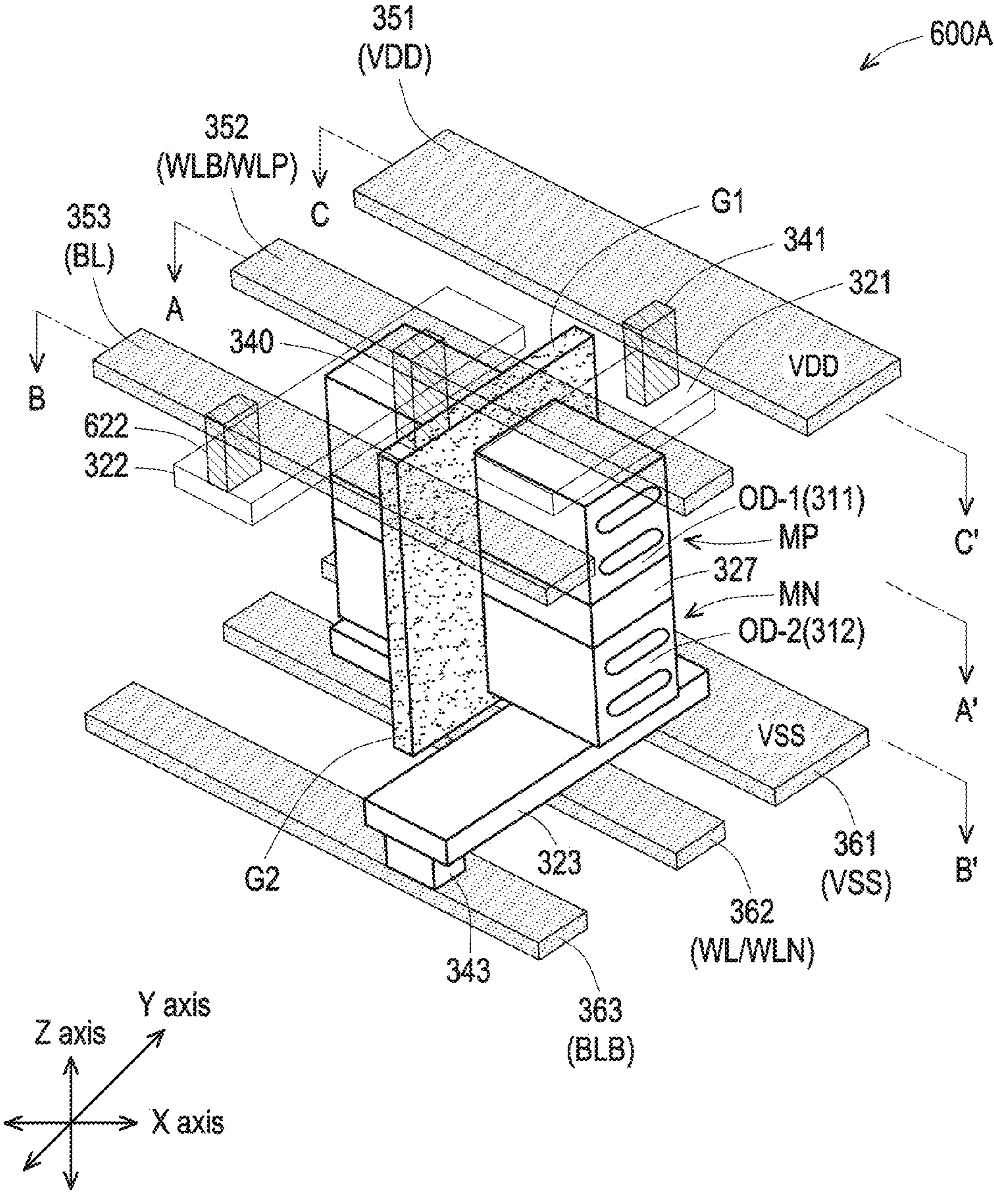
FIGS. 6A-6D are schematic perspective views of various CFET devices configured as memory cells, in accordance with some embodiments.
Figure 6B:
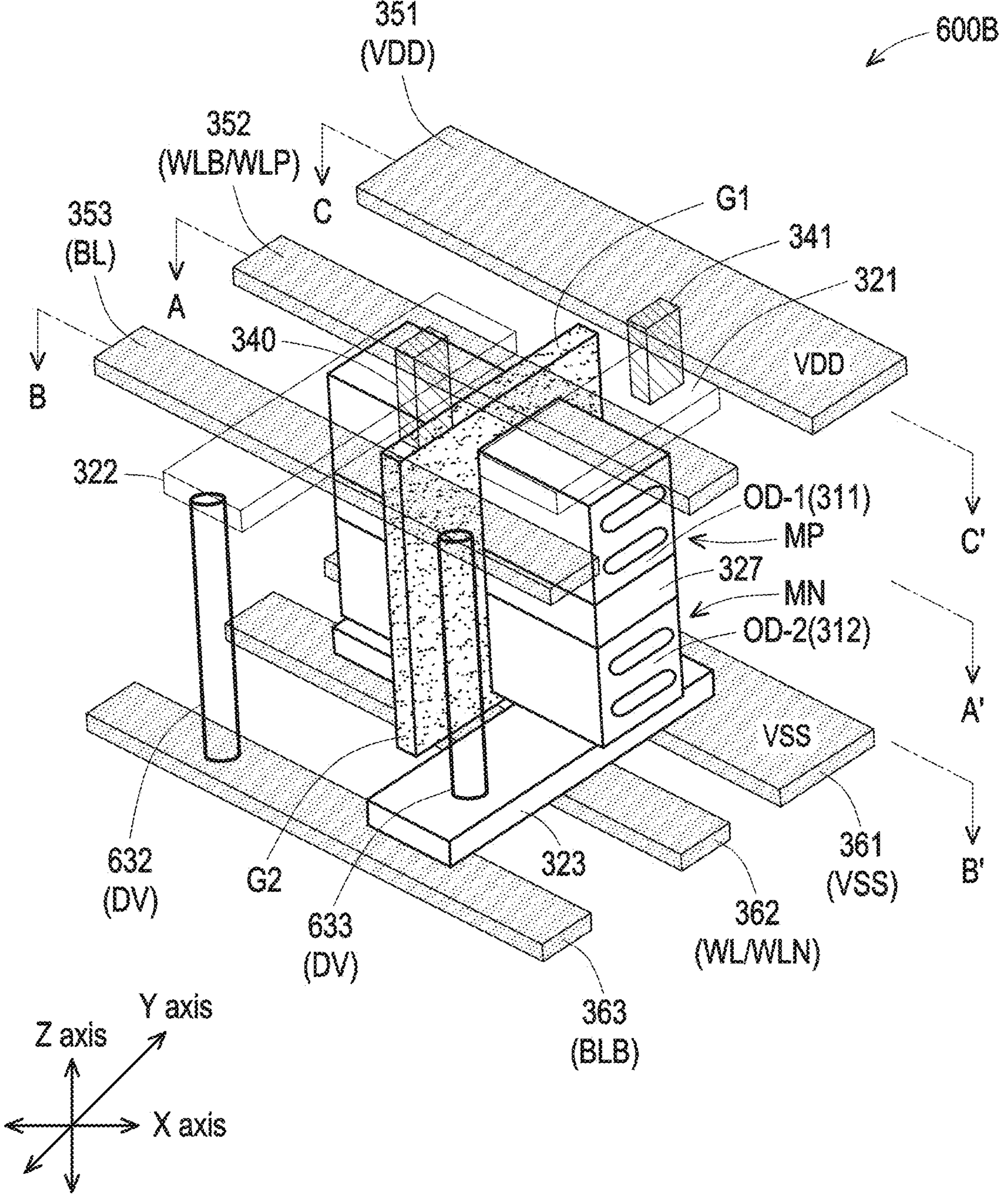

The CFET devices 600A, 600B in FIGS. 6A, 6B each comprise a P-on-N structure similar to the CFET device 300A, and are configured to correspondingly store logic "1" and logic "0" as described with respect to the memory cells 500A, 500B. The CFET devices 600C, 600D in FIGS. 6C, 6D each comprise an N-on-P structure similar to the CFET device 300B, and are configured to correspondingly store logic "1" and logic "0" as described with respect to the memory cells 500A, 500B. For simplicity, corresponding components in FIGS. 1, 3A-3B, 5A-5B, 6A-6D are designated by the same reference numerals.

In FIG. 6A, the CFET device 600A comprises a P-on-N structure similar to the CFET device 300A. Differences between the CFET device 600A and CFET device 300A are described herein. The VLI 330 of the CFET device 300A is omitted in the CFET device 600A. Instead of the VLI 330, the CFET device 600A comprises a VD via 622 electrically coupling the underlying MD contact 322 to the overlying M0 conductive pattern 353. The M0 conductive pattern 353 in the CFET device 600A is configured as a bit line BL, and is sometimes referred to as bit line BL 353.

The M0 conductive pattern 351 is configured as a VDD power rail, and is electrically coupled to the source of the transistor MP through the VD via 341 and MD contact 321. The BM0 conductive pattern 361 is configured as a VSS power rail, and is electrically coupled to the source of the transistor MN through a corresponding BVD via and BMD contact, as described herein. The M0 conductive pattern 352 is configured as a word line WLB, and is electrically coupled to the gate G1 of the transistor MP through the VG via 340. The BM0 conductive pattern 362 is configured as a word line WL, and is electrically coupled to the gate G2 of the transistor MN through a corresponding BVG via, as described herein. The bit line BL 353 is electrically coupled to the drain of the transistor MP through the MD contact 322 and VD via 622. The BM0 conductive pattern 363 is configured as a bit line BLB, and is electrically coupled to the drain of the transistor MN through the BVD via 343 and BMD contact 323.

The electrical connection of the bit line BL 353 to the drain of the transistor MP through the VD via 622, and the electrical connection of the bit line BLB 363 to the drain of the transistor MN through the BVD via 343 configure the CFET device 600A in a manner similar to the memory cell 500A to store a logic value of logic "1".

In FIG. 6B, the CFET device 600B comprises a P-on-N structure similar to the CFET device 600A. Compared to the CFET device 600A, the CFET device 600B comprises deep vias (DV) 632, 633 instead of the VD via 622 and BVD via 343 of the CFET device 600A. The deep via 632 extends along the Z axis, from a lower surface of the MD contact 322 to an upper surface of the bit line BLB 363, and electrically couples the MD contact 322 and the drain of the transistor MP to the bit line BLB 363. The deep via 633 extends along the Z axis, from a lower surface of the bit line BL 353 to an upper surface of the BMD contact 323, and electrically couples the BMD contact 323 and the drain of the transistor MN to the bit line BL 353.

The electrical connection of the bit line BL 353 to the drain of the transistor MN through the deep via 633, and the electrical connection of the bit line BLB 363 to the drain of the transistor MP through the deep via 632 configure the CFET device 600B in a manner similar to the memory cell 500B to store a logic value of logic "0".

In some embodiments, the described electrical connections of the gate G1 to the word line WLP 352, the gate G2 to the word line WLN 362, the source of the transistor MP to the VDD power rail 351, the source of the transistor MN to the VSS power rail 361 are present in all CFET devices configured as memory cells in a ROM device. Each CFET device is configured to store logic "1" by the presence of VD via 622 and BVD via 343 electrically coupling the drains of the transistors MP, MN correspondingly to the bit line BL 353 and bit line BLB 363 as in FIG. 6A, or to store logic "0" by the presence of deep vias 632, 633 electrically coupling the drains of the transistors MN, MP correspondingly to the bit line BL 353 and bit line BLB 363 as in FIG. 6B.

In some embodiments, a layout diagram of a memory array in a ROM device is generated, e.g., by an EDA tool or system as described herein. The layout diagram comprises layouts of multiple CFET devices corresponding to the CFET devices 600A, 600B which are arranged in rows and columns of the memory array. The layouts of the CFET devices are identical to each other, except for the presence of a pair of a VD via and a BVD via (corresponding to VD via 622 and BVD via 343) or the presence of a pair of deep vias (corresponding to deep vias 632, 633). The EDA tool or system is configured to generate, or "drop," a pair of VD and BVD vias or a pair of deep vias in the layout diagram of the memory array, based on the data (i.e., a set of various logic "1" and logic "0") to be stored in the ROM device. Based on the VD vias, BVD vias and deep vias dropped in the layout diagram of the memory array, corresponding masks are fabricated and used for manufacturing corresponding ROM devices, e.g., by an IC manufacturing system. The described process is an example. Other design or manufacturing processes are within the scopes of various embodiments.

Figure 6C:
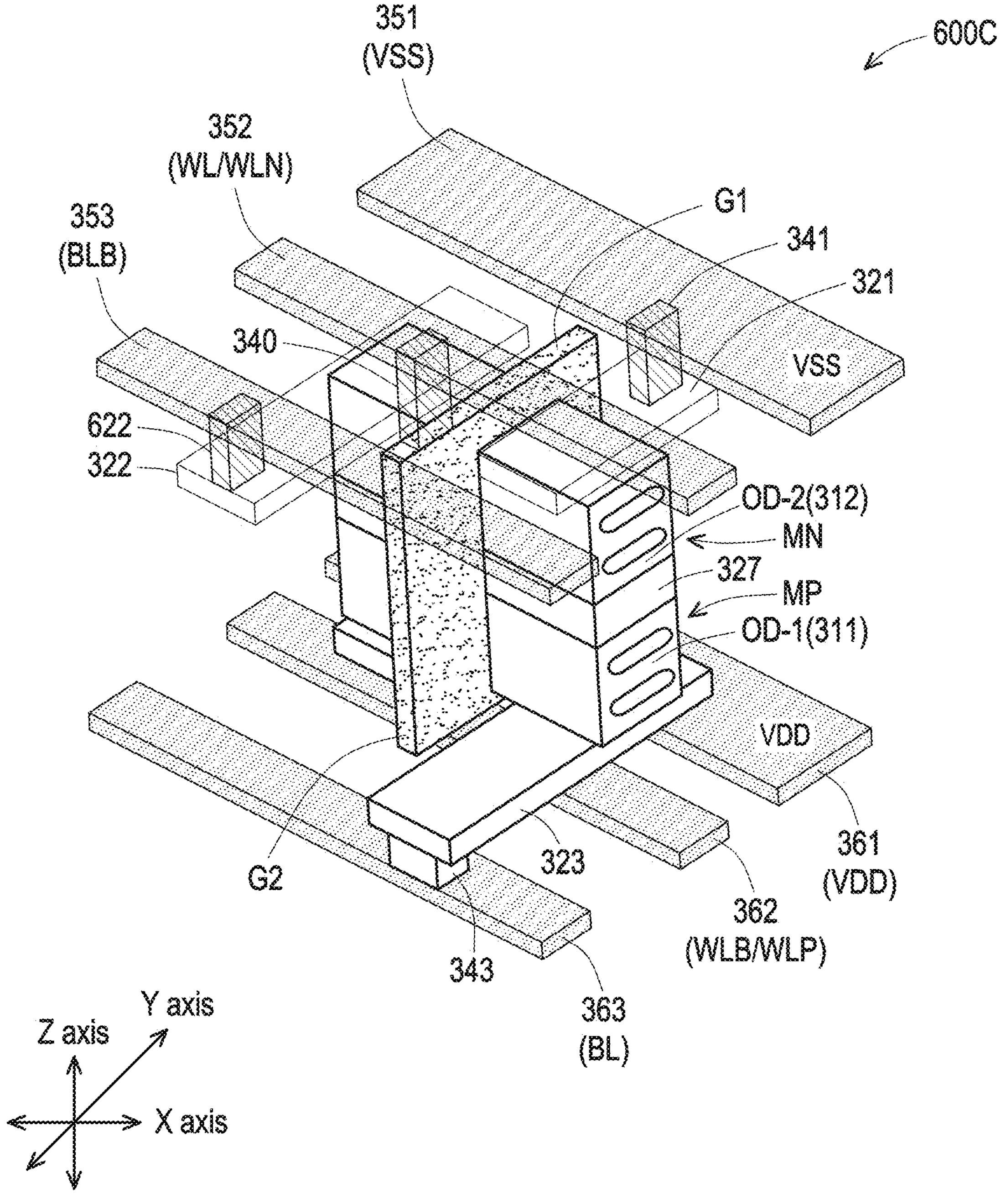

In FIG. 6C, the CFET device 600C comprises an N-on-P structure similar to the CFET device 300B. Differences between the CFET device 600C and CFET device 300B are described herein. The VLI 330 of the CFET device 300B is omitted in the CFET device 600C. Instead of the YLI 330, the CFET device 600C comprises a VD via 622 electrically coupling the underlying MD contact 322 to the overlying M0 conductive pattern 353 which is configured as a bit line BLB. The BM0 conductive pattern 363 in the CFET device 600C is configured as a bit line BL.

The electrical connection of the BM0 conductive pattern 363 configured as a bit line BL to the drain of the transistor MP through the BVD via 343, and the electrical connection of the M0 conductive pattern 353 configured as a bit line BLB to the drain of the transistor MN through the VD via 622 configure the CFET device 600C in a manner similar to the memory cell 500A to store a logic value of logic "1".

Figure 6D:
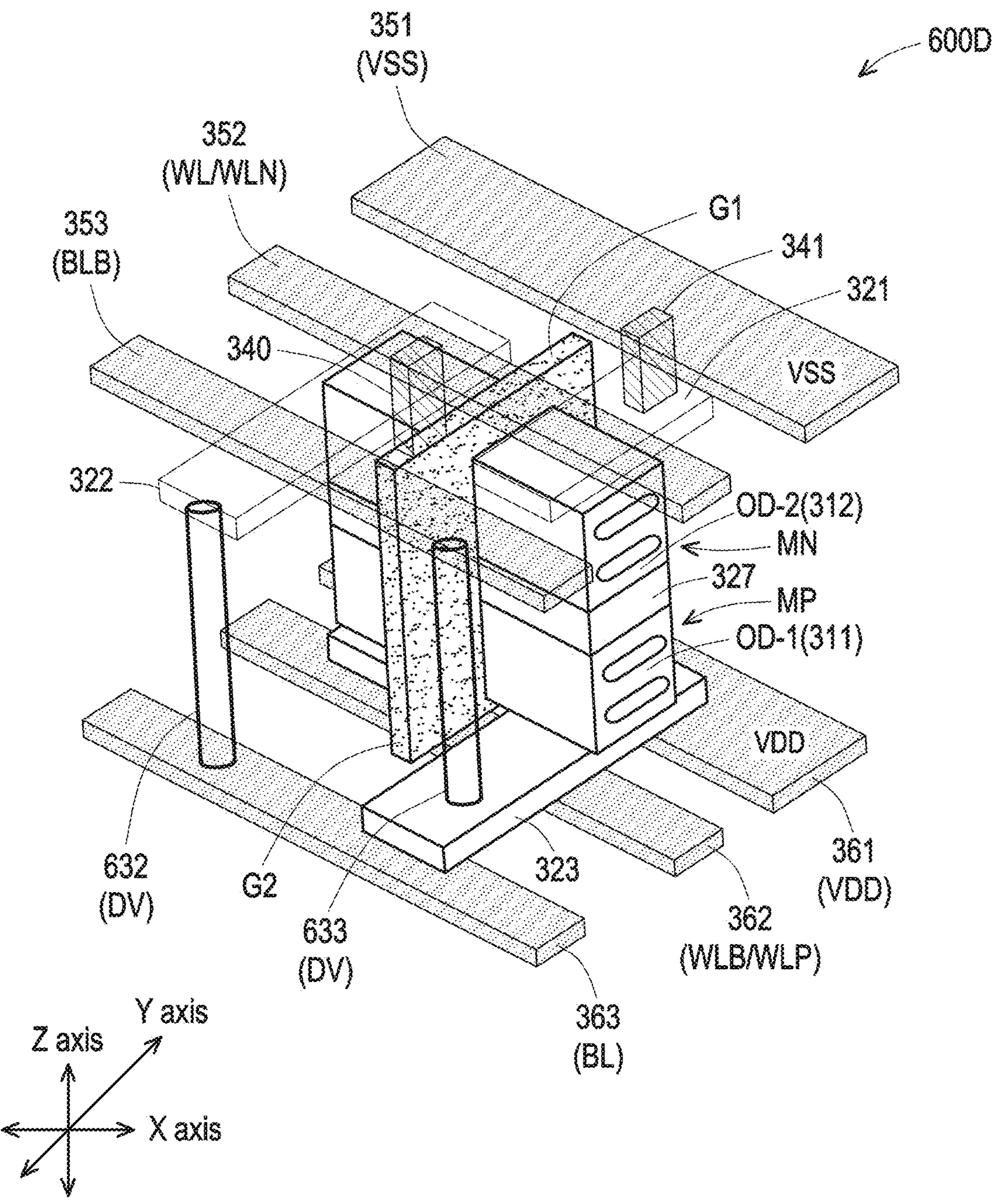

In FIG. 6D, the CFET device 600D comprises an N-on-P structure similar to the CFET device 600C. Compared to the CFET device 600C, the CFET device 600D comprises deep vias (DV) 632, 633 instead of the VD via 622 and BVD via 343 of the CFET device 600C.

The electrical connection of the BM0 conductive pattern 363 configured as a bit line BL to the drain of the transistor MN through the deep via 632, and the electrical connection of the M0 conductive pattern 353 configured as a bit line BLB to the drain of the transistor MP through the deep via 633 configure the CFET device 600D in a manner similar to the memory cell 500B to store a logic value of logic "0". In at least one embodiment, one or more advantages described herein are achievable by one or more of the CFET devices 600A-600D, and/or by one or more ROM devices including one or more of the CFET devices 600A-600D.

Figure 7A:
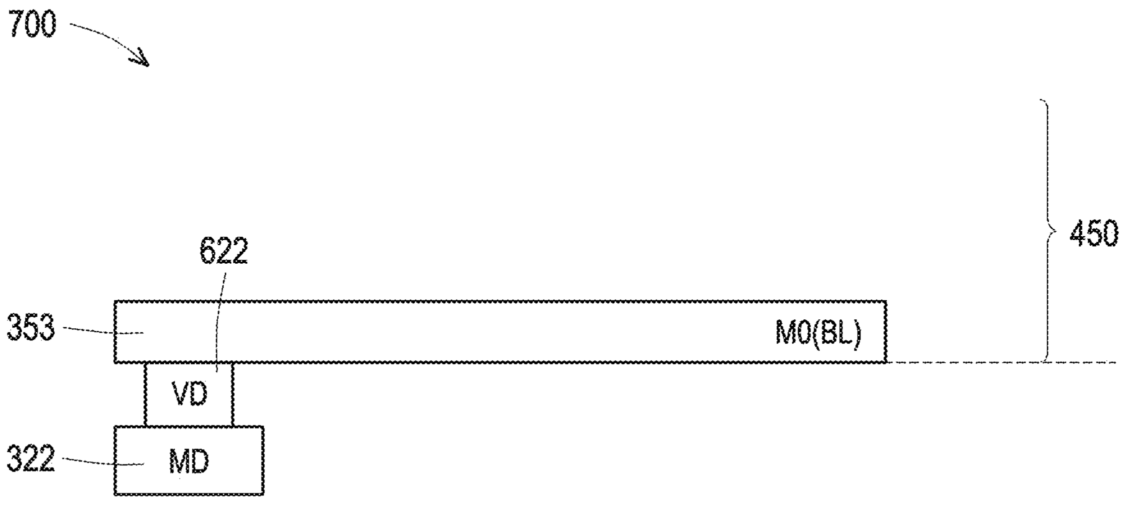
FIGS. 7A-7B are schematic cross-sectional views of various portions of a memory device, in accordance with some embodiments.
Figure 7A:
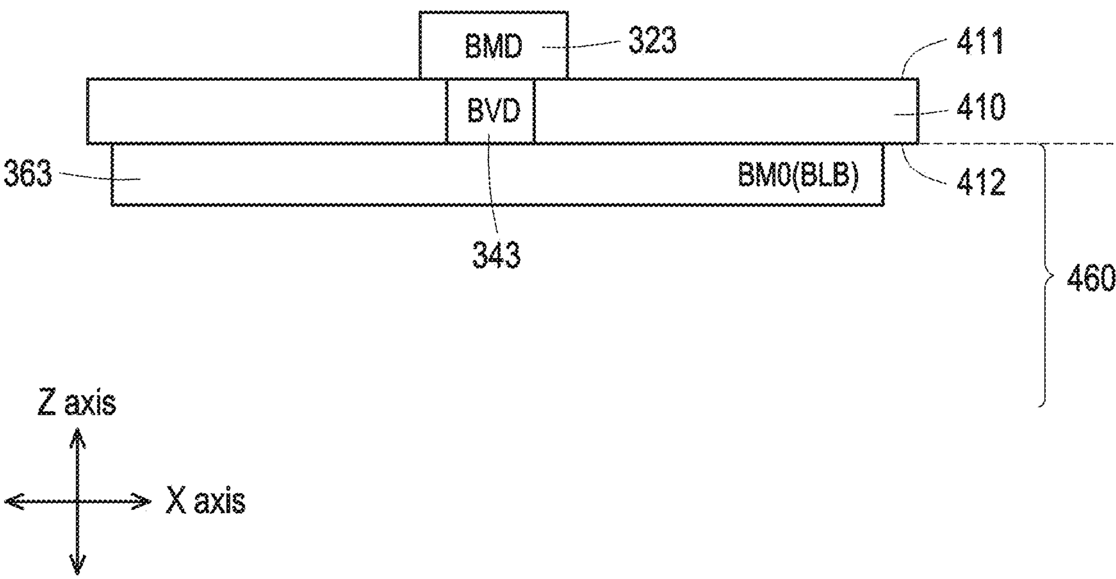
Figure 7B:
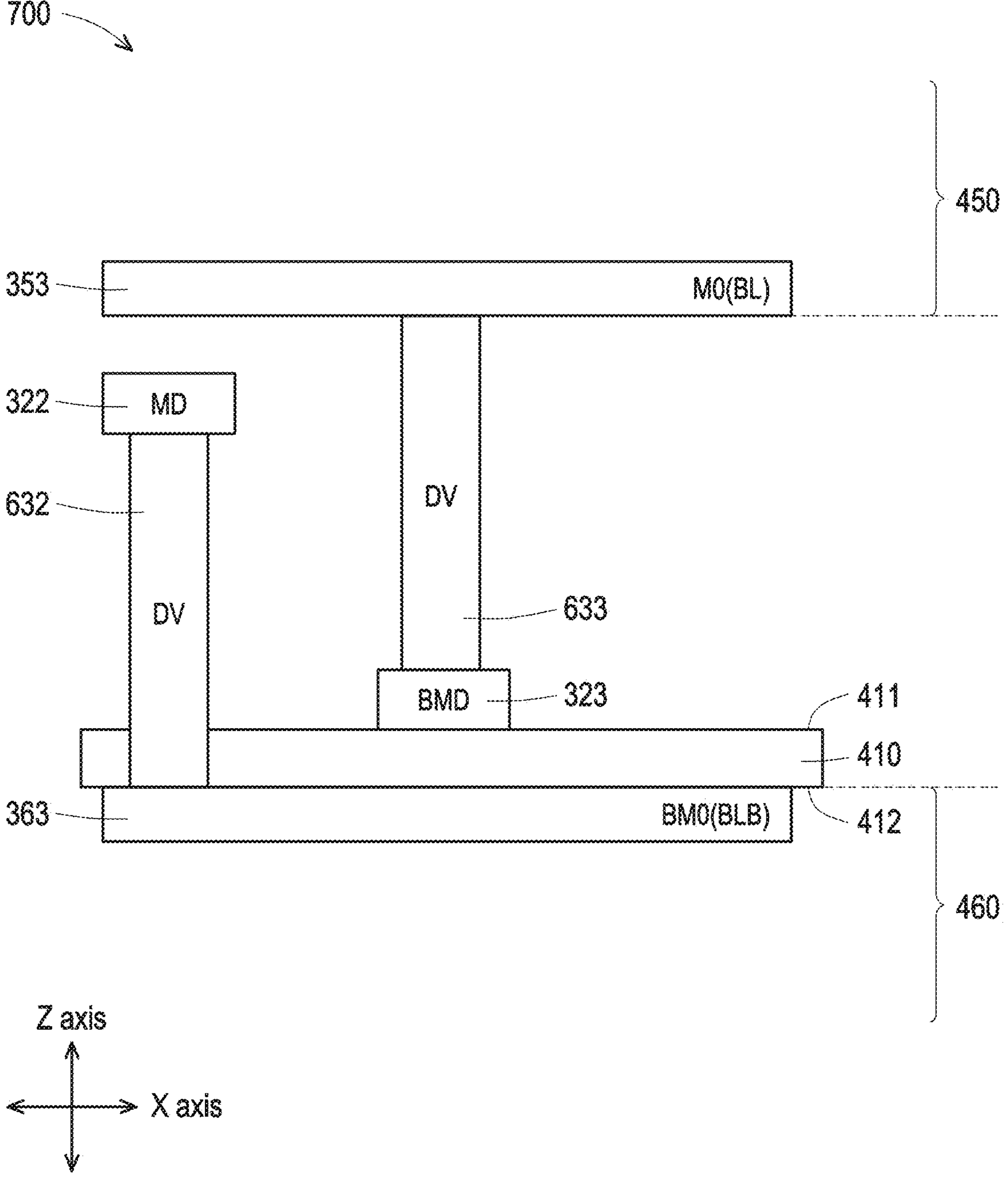

FIGS. 7A, 7B are schematic cross-sectional views of various portions of a memory device 700, in accordance with some embodiments. The portion of the memory device 700 in FIG. 7A corresponds to the CFET device 600A. The portion of the memory device 700 in FIG. 7B corresponds to the CFET device 600B. The views in FIGS. 7A, 7B correspond to cross-sectional views taken along lines B-B' in FIGS. 6A, 6B. Cross-sectional views taken along lines A-A' and C-C' in FIGS. 6A, 6B are similar to the cross-sectional views in FIGS. 4A, 4C. For simplicity, corresponding components in FIGS. 4A-4C, 6A-6B, 7A-7B are designated by the same reference numerals.

In FIG. 7A, a CFET device configured to store logic "1" in the memory device 700 is shown to include VD via 622 and BVD via 343 electrically coupling the drains of the transistors MP, MN correspondingly to the bit line BL 353 and bit line BLB 363.

In FIG. 7B, another CFET device configured to store logic "0" in the memory device 700 is shown to include, instead of VD via 622 and BVD via 343, a pair of deep vias 632, 633 electrically coupling the drains of the transistors MP, MN correspondingly to the bit line BLB 363 and bit line BL 353. In at least one embodiment, one or more advantages described herein are achievable by the memory device 700.

Figure 8:
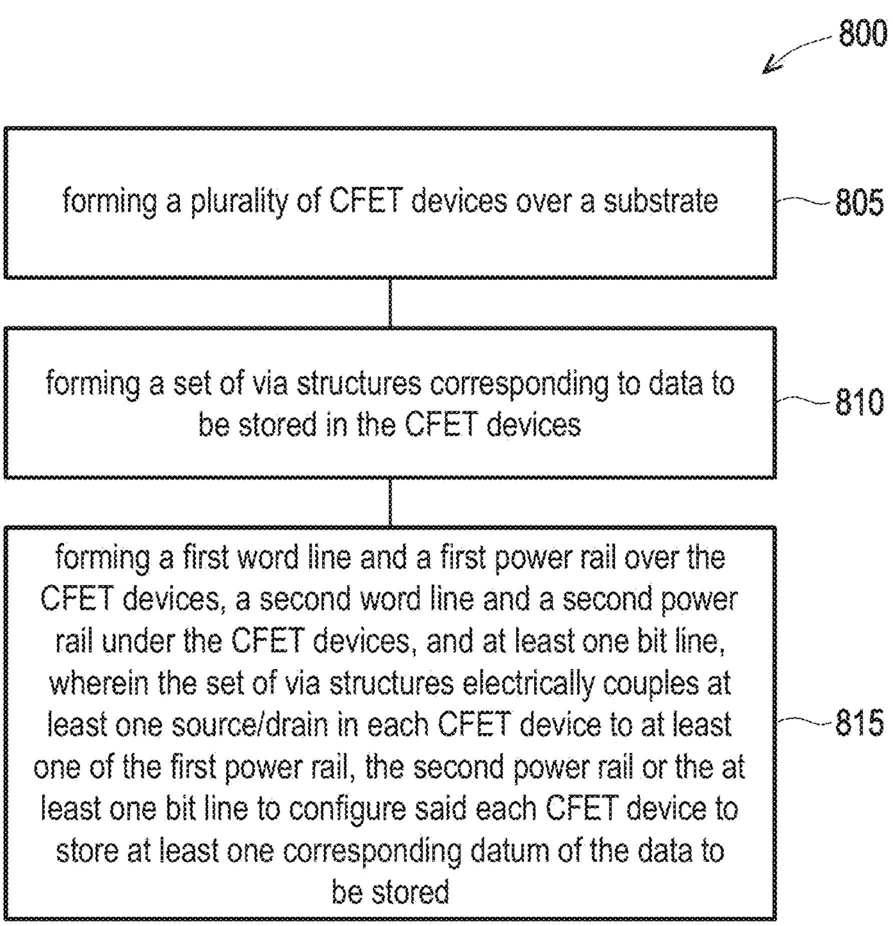
FIG. 8 is a flow chart of a method of manufacturing a ROM device comprising CFET devices, in accordance with some embodiments.

FIG. 8 is a flow chart of a method 800 of manufacturing a ROM device comprising CFET devices, in accordance with some embodiments. In some embodiments, the method 800 is usable to manufacture one or more memory devices or ROM devices as described herein.

At operation 805, a plurality CFET devices is formed over a front side of a substrate, the CFET devices configuring a plurality of memory cells arranged in a memory array. For example, various CFET devices are formed over a front side 411 of a substrate 410 to configure memory cells in a memory array.

Referring to FIGS. 4A-4C, an example manufacturing process starts from the substrate 410. In some embodiments, the substrate 410 is a silicon-on-insulator (SOI) substrate having a semiconductor bulk, and an insulation layer over the semiconductor bulk. Other substrate configurations are within the scopes of various embodiments.

Alternating layers of a first semiconductor material and a second semiconductor material different from the first semiconductor material are sequentially deposited over the front side 411 of the substrate 410. In some embodiments, the first semiconductor material comprises silicon, and the second semiconductor material comprises SiGe. As a result, alternating SiGe/Si/SiGe/Si layers are stacked over the front side 411 of the substrate 410. In some embodiments, the alternating layers SiGe/Si/SiGe/Si are formed by an epitaxy process. Other materials and/or manufacturing processes for the alternating layers of the different first and second semiconductor materials are within the scopes of various embodiments.

In some embodiments, dummy gate structures (not shown) are formed over the alternating layers SiGe/Si/SiGe/Si, to be used as a mask for subsequent patterning, and for later formation of a metal gate. In an example, each dummy gate structure includes various dummy layers, such as a dummy gate electrode (e.g., polysilicon), a hard mask layer (e.g., SiN, SiCN, SiO, or the like). The dummy gate structures are formed by deposition processes, lithography processes, etching processes, combinations thereof, or the like. The alternating layers SiGe/Si/SiGe/Si are patterned by using the dummy gate structures as a mask.

Various semiconductor devices are next fabricated. In at least one embodiment, isolation regions are formed in trenches to separate and electrically isolate active regions of the devices to be manufactured. In some embodiments, one or more dielectric materials, such as SiO and/or SiN, are deposited, e.g., by chemical vapor deposition (CVD), plasma enhanced CVD (PECVD), atomic layer deposition (ALD), physical vapor deposition (PVD), thermal oxidation, or the like. Subsequently, the dielectric material is recessed, e.g., by etching and/or chemical mechanical polishing (CMP) to form the isolation regions.

In some embodiments, SiGe at exposed edges of the alternating layers SiGe/Si/SiGe/Si are selectively removed by an etching process. In some embodiments, the selective removal of SiGe include an oxidation process followed by a selective etching.

In some embodiments, source/drains features similar to the source/drains 311, 312, 413, 414 are epitaxially grown as epitaxy structures. The source/drain features are grown to be in contact with the exposed edges of the Si layers. Example epitaxy processes include, but are not limited to, CVD deposition, ultra-high vacuum CVD (UHV-CVD), low-pressure CVD (LPCVD), plasma-enhanced CVD (PECVD), selective epitaxial growth (SEG) or the like.

In some embodiments, a metal gate replacement process is performed to replace the dummy gate structures with metal gate structures. In some embodiments, the dummy gate structures are removed by one or more etching processes, such as wet etching, dry etching, or the like. The SiGe layers are selectively removed by a selective oxidation/etching process. The Si layers remain, and configure nanosheets 461, 462 for top and bottom semiconductor devices. Metal gate structures are formed to wrap around the nanosheets 461, 462. In some embodiments, each metal gate structure includes a gate dielectric wrapping around the nanosheets 461, 462, and a metal gate, e.g., gate G1, gate G2, over the gate dielectric to obtain corresponding top and bottom semiconductor devices, e.g., transistors MP, MN. Example materials of the gate dielectric includes a high-k dielectric material, such as HfO2, HfSiO, HfSiO4, HfSiON, HfLaO, HfTaO, HfTiO, HfZrO, HAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, or the like. In some embodiments, the gate dielectric is deposited by CVD, PVD, ALD, or the like. In some embodiments, each metal gate includes one or more metals such as Al, Cu, W, Ti, Ta, TiN, TaN, NiSi, CoSi, and is formed by, e.g., CVD, ALD, PVD, plating, chemical oxidation, thermal oxidation, or the like.

One or more MD contacts, BMD contacts, VLIs are formed, e.g., by etching and metal depositing operations.

At operation 810, deposition and patterning operations are performed to form a set of via structures corresponding to data to be stored in the CFET devices. In some embodiments, the set of via structures comprises VD vias for electrically coupling sources of the top and/or bottom semiconductor devices in the CFET devices to corresponding VDD or VSS power rails, as described with respect to FIGS. 2A-4C. In some embodiments, the set of via structures comprises VD vias and/or deep vias for electrically coupling drains of the top and/or bottom semiconductor devices in the CFET devices to corresponding differential bit lines, as described with respect to FIGS. 5A-7B. In at least one embodiment, the set of via structures is formed by etching and metal depositing operations.

At operation 815, a first word line and a first power rail are formed over the CFET devices, a second word line and a second power rail are formed under the CFET devices, and at least one bit line is formed. For example, the first word line and first power rail are formed as parts of a front side redistribution structure over the front side of the substrate, whereas the second word line and second power rail are formed as parts of a back side redistribution structure under the substrate. For example, a front side redistribution structure 450 is formed over the front side 411 of the substrate 410, and a back side redistribution structure 460 is formed at the back side 412 of the substrate 410.

In an example manufacturing process, after forming the front side redistribution structure 450, the IC device being manufactured is flipped upside down and temporarily bonded to a carrier. Wafer thinning is performed from the back side 412 (now facing upward) to remove a portion of the substrate 410. In some embodiments, the wafer thinning process includes a grinding operation, a polishing operation (such as, chemical mechanical polishing (CMP)), or the like. In at least one embodiment, an original substrate for forming the CFET devices is completely removed, and a new substrate, e.g., an insulation substrate, is formed over the CFET devices. A back side redistribution structure 460 is formed over the back side 412 of the substrate 410 by deposition and patterning operations.

The formation of the front side redistribution structure 450 and back side redistribution structure 460 result in a ROM device in which the set of via structures obtained at operation 810 electrically couples at least one source/drain in each CFET device to at least one of the first power rail, the second power rail or the at least one bit line, to configure said each CFET device to store at least one corresponding datum of the data to be stored, for example, as described with respect to FIGS. 3A-4C, 6A-7B. In some embodiments, one or more advantages described herein are achievable by one or more memory devices manufactured by the method 800. Although the described manufacturing processes include formation of nanosheet devices in one or more embodiments, other types of devices, e.g., nanowire, FinFET, planar, or the like, are within the scopes of various embodiments. The described manufacturing processes and/or orders of operations are examples. Other manufacturing processes and/or orders of operations are within the scopes of various embodiments.

Figure 9:
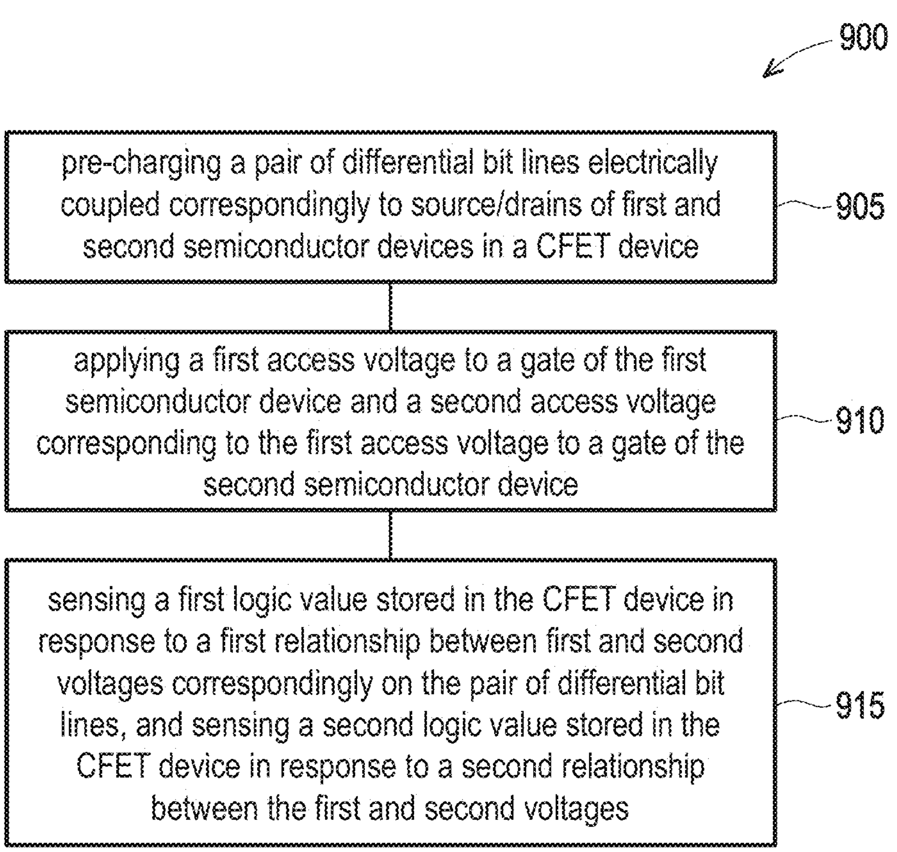
FIG. 9 is a flow chart of a method of operating a ROM device comprising CFET devices, in accordance with some embodiments.

FIG. 9 is a flow chart of a method 900 of operating a ROM device comprising CFET devices, in accordance with some embodiments. In some embodiments, the method 900 is performed in a read operation of a CFET device configured as a memory cell as described with respect to FIGS. 5A-5D.

At operation 905, a pair of differential bit lines electrically coupled correspondingly to source/drains of first and second semiconductor devices in a CFET device is pre-charged. For example, as described with respect to FIGS. 5A, 5B, a bit line BL in a pair of differential bit lines BL, BLB is electrically coupled to a source/drain (211 or 221) of a first semiconductor device (transistor MP or transistor MN) of a CFET device (memory cell 500A or 500B). The other bit line BLB is electrically coupled to a source/drain (221 or 211) of a second semiconductor device (transistor MN or transistor MP) of the CFET device. The differential bit lines BL, BLB are pre-charged to a pre-charge voltage 531, as described with respect to FIGS. 5C, 5D.

At operation 910, a first access voltage is applied to a gate of the first semiconductor device, and a second access voltage corresponding to the first access voltage is applied to a gate of the second semiconductor device. For example, as described with respect to FIGS. 5A-5D, an access voltage 532 is applied to the word line WLN electrically coupled to the gate of the transistor MN, and another access voltage (not shown) being an inverted signal of the access voltage 532 is applied to the word line WLP electrically coupled to the gate of the transistor MP. The applied access voltages turn ON the transistors MP, MN which are coupled to corresponding VDD and VSS power rails and cause the pre-charge voltage 531 on the differential bit lines BL, BLB to vary in accordance with the datum stored in the CFET device.

At operation 915, a first logic value or a different second logic value stored in the CFET device is sensed in response to different corresponding first and second relationships between first and second voltages on the pair of differential bit lines. For example, the first relationship corresponds to a voltage difference dV1 between the first voltage on bit line BL and the second voltage on the bit line BLB being of a first sign (e.g., positive) and having a magnitude greater than a level detectable by a double-ended sense amplifier.

In response to the first relationship being detected, i.e., the voltage difference dV1 being positive and equal to or greater than a predetermined threshold, the sense amplifier outputs data indicating that logic “1” is stored in the CFET device.

In response to the second relationship being detected, i.e., the voltage difference dV2 being negative and equal to or greater than a predetermined threshold voltage, the sense amplifier outputs data indicating that logic “0” is stored in the CFET device. In at least one embodiment, one or more advantages described herein are achievable by the method 900.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 10:
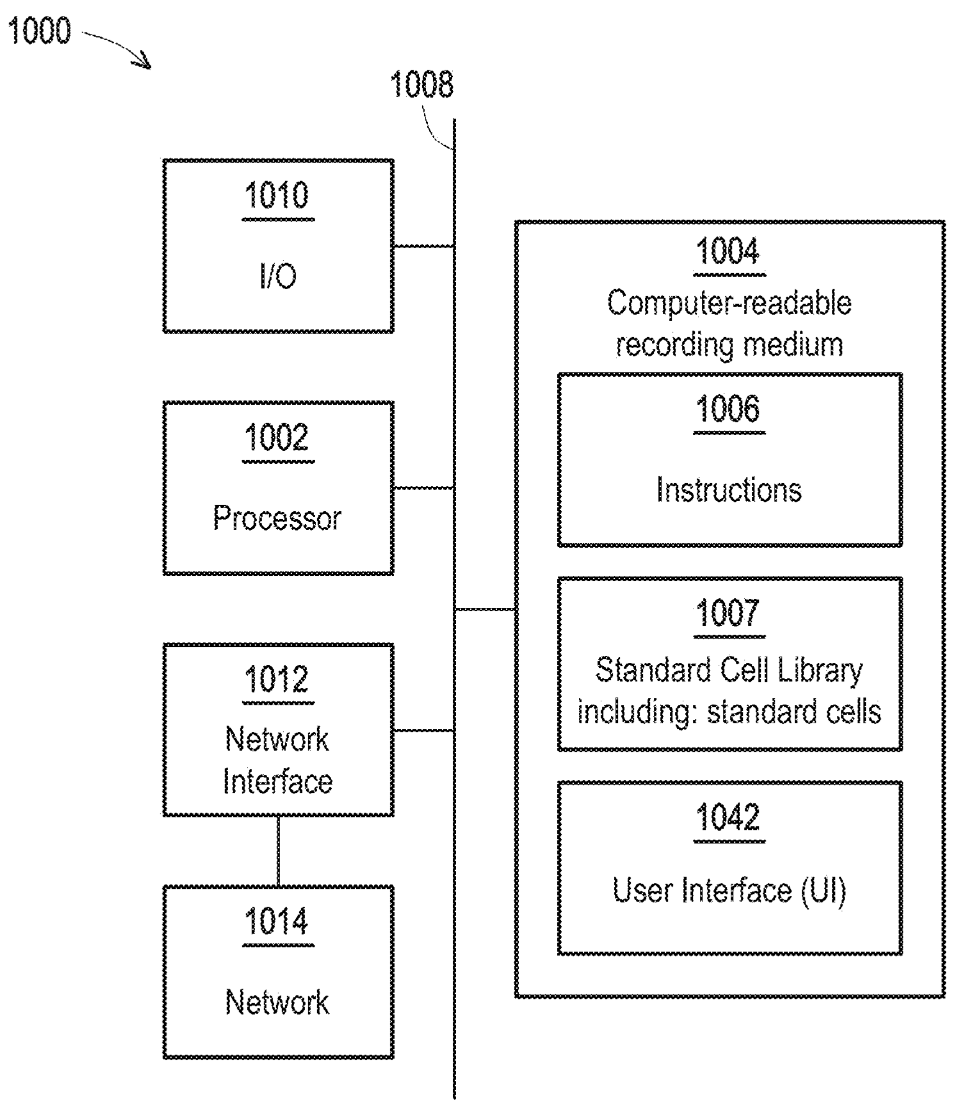
FIG. 10 is a block diagram of an electronic design automation (EDA) system in accordance with some embodiments.

FIG. 10 is a block diagram of an electronic design automation (EDA) system 1000 in accordance with some embodiments.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable recording medium 1004. Recording medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable recording medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable recording medium 1004 are capable of connecting to external elements via network 1014. Processor 1002 is configured to execute computer program code 1006 encoded in computer-readable recording medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable recording medium 1004 is an electronic, magnetic, optical, electromagnetic, infrared, and/or a semiconductor system (or apparatus or device). For example, computer-readable recording medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable recording medium 1004 includes a compact disk-read only memory (CD-ROM), a compact disk-read/write (CD-R/W), and/or a digital video disc (DVD).

In one or more embodiments, recording medium 1004 stores computer program code 1006 configured to cause system 1000 (where such execution represents (at least in part) the EDA tool) to be usable for performing a portion or all of the noted processes and/or methods. In one or more embodiments, recording medium 1004 also stores information which facilitates performing a portion or all of the noted processes and/or methods. In one or more embodiments, recording medium 1004 stores library 1007 of standard cells including such standard cells as disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable recording medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
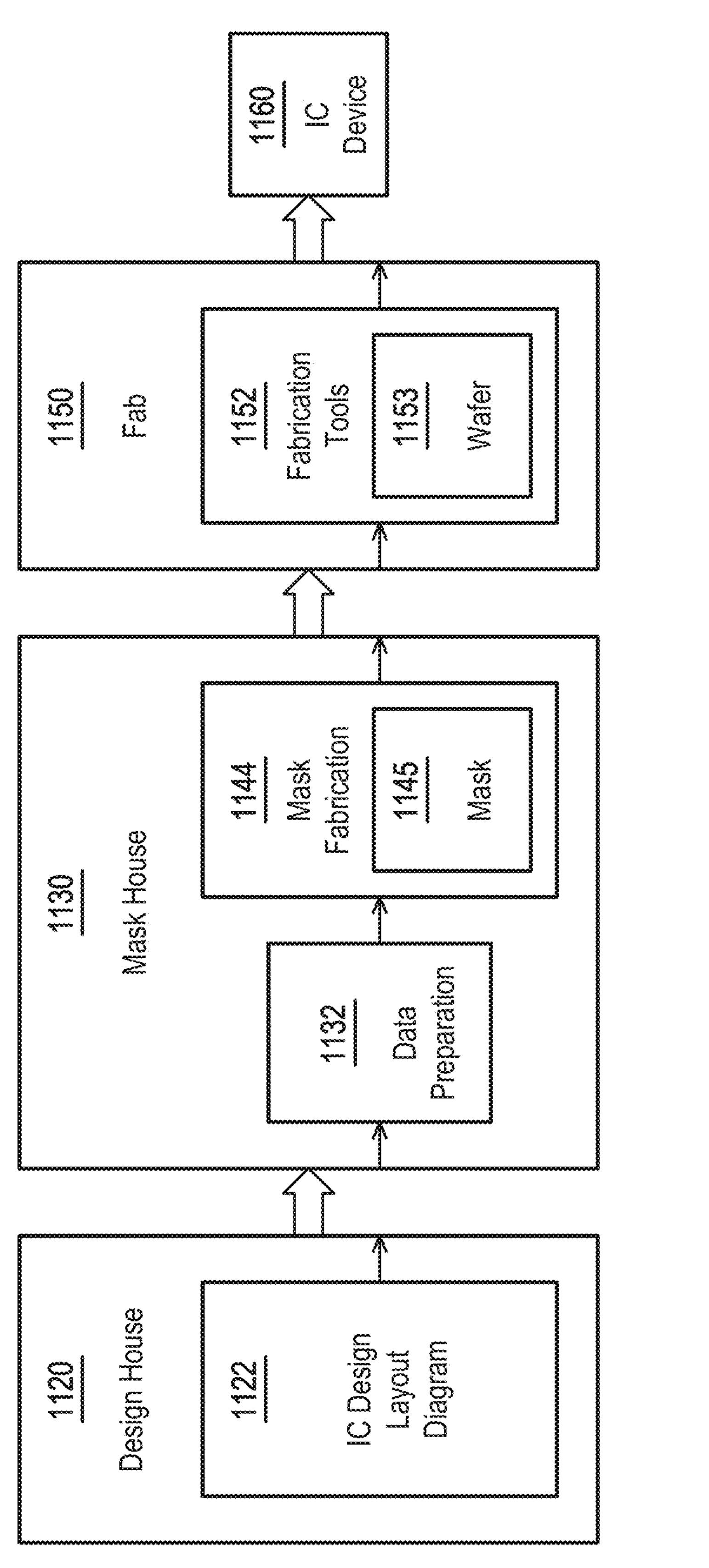
FIG. 11 is a block diagram of an IC device manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place-and-route operation. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

In some embodiments, a read-only memory (ROM) device comprises a complementary field effect transistor (CFET) device comprising a first semiconductor device of a first type, and a second semiconductor device of a second type different from the first type. The second semiconductor device is over or under the first semiconductor device. A first word line is electrically coupled to a gate of the first semiconductor device. A second word line is electrically coupled to a gate of the second semiconductor device. At least one bit line is electrically coupled to at least one of a first source/drain of the first semiconductor device, or a first source/drain of the second semiconductor device.

In some embodiments, a read-only memory (ROM) device comprises a complementary field effect transistor (CFET) device comprising a first semiconductor device of a first type, and a second semiconductor device of a second type different from the first type. The second semiconductor device is under the first semiconductor device. A first word line is electrically coupled to a gate of the first semiconductor device. A second word line is electrically coupled to a gate of the second semiconductor device. A bit line is electrically coupled to a first source/drain of the first semiconductor device and a first source/drain of the second semiconductor device.

A method in accordance with some embodiments comprises pre-charging a pair of differential bit lines. One of the pair of differential bit lines is electrically coupled to a source/drain of a first semiconductor device of a complementary field effect transistor (CFET) device. The other of the pair of differential bit lines is electrically coupled to a source/drain of a second semiconductor device of the CFET device. The second semiconductor device is over or under the first semiconductor device. The method further comprises applying a first access voltage to a gate of the first semiconductor device and a second access voltage to a gate of the second semiconductor device. The second access voltage corresponds to the first access voltage. The method further comprises sensing a first logic value stored in the CFET device in response to a first relationship between first and second voltages correspondingly on the pair of differential bit lines, and sensing a second logic value stored in the CFET device in response to a second relationship between the first and second voltages. The second logic value is different from the first logic value, and the second relationship is different from the first relationship.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A read-only memory (ROM) device, comprising:

a complementary field effect transistor (CFET) device comprising:

a first semiconductor device of a first type; and a second semiconductor device of a second type different from the first type, the second semiconductor device over or under the first semiconductor device;

a first word line electrically coupled to a gate of the first semiconductor device;

a second word line electrically coupled to a gate of the second semiconductor device; and at least one bit line electrically coupled to at least one of a first source/drain of the first semiconductor device, or a first source/drain of the second semiconductor device, wherein the first semiconductor device is configured to store a first logic value, and the second semiconductor device is configured to store a second logic value, independently of the first logic value stored in the first semiconductor device.

2. The ROM device of claim 1, wherein the first logic value and the second logic value are the same logic value.

3. The ROM device of claim 1, wherein the first logic value and the second logic value are different logic values.

4. The ROM device of claim 1, wherein the at least one bit line comprises a bit line electrically coupled to both the first source/drain of the first semiconductor device and the first source/drain of the second semiconductor device.

5. The ROM device of claim 4, further comprising:

a first power rail configured to carry a first power supply voltage; and a second power rail configured to carry a second power supply voltage different from the first power supply voltage, wherein an electrical connection between the first power rail and a second source/drain of the first semiconductor device corresponds to the first logic value stored in the first semiconductor device, and an electrical disconnection between the second power rail and a second source/drain of the second semiconductor device corresponds to the second logic value stored in the second semiconductor device, wherein the second logic value is the same as the first logic value.

6. The ROM device of claim 4, further comprising:

a first power rail configured to carry a first power supply voltage; and a second power rail configured to carry a second power supply voltage different from the first power supply voltage, wherein an electrical disconnection between the first power rail and a second source/drain of the first semiconductor device corresponds to the first logic value stored in the first semiconductor device, and an electrical disconnection between the second power rail and a second source/drain of the second semiconductor device corresponds to the second logic value stored in the second semiconductor device, wherein the second logic value is different from the first logic value.

7. The ROM device of claim 4, further comprising:

a first power rail configured to carry a first power supply voltage; and a second power rail configured to carry a second power supply voltage different from the first power supply voltage, wherein an electrical connection between the first power rail and a second source/drain of the first semiconductor device corresponds to the first logic value stored in the first semiconductor device, and an electrical connection between the second power rail and a second source/drain of the second semiconductor device corresponds to the second logic value stored in the second semiconductor device, wherein the second logic value is different from the first logic value.

8. The ROM device of claim 4, further comprising:

a first power rail configured to carry a first power supply voltage; and a second power rail configured to carry a second power supply voltage different from the first power supply voltage, wherein an electrical disconnection between the first power rail and a second source/drain of the first semiconductor device corresponds to the first logic value stored in the first semiconductor device, and an electrical connection between the second power rail and a second source/drain of the second semiconductor device corresponds to the second logic value stored in the second semiconductor device, wherein the second logic value is the same as the first logic value.

9. A read-only memory (ROM) device, comprising:

a complementary field effect transistor (CFET) device comprising:

a first semiconductor device of a first type; and a second semiconductor device of a second type different from the first type, the second semiconductor device under the first semiconductor device;

a first word line electrically coupled to a gate of the first semiconductor device;

a second word line electrically coupled to a gate of the second semiconductor device; and a bit line electrically coupled to both a first source/drain of the first semiconductor device and a first source/drain of the second semiconductor device, wherein a second source/drain of the first semiconductor device and a second source/drain of the second semiconductor device are electrically disconnected from each other.

10. The ROM device of claim 9, further comprising:

a first power rail configured to carry a first power supply voltage; and a second power rail configured to carry a second power supply voltage different from the first power supply voltage.

11. The ROM device of claim 10, wherein the first power rail is electrically disconnected from the second source/drain of the first semiconductor device, corresponding to a first logic value stored in the first semiconductor device, and the second power rail is electrically coupled to the second source/drain of the second semiconductor device, corresponding to the first logic value stored in the second semiconductor device.

12. The ROM device of claim 10, wherein the first power rail is electrically disconnected from the second source/drain of the first semiconductor device, corresponding to a first logic value stored in the first semiconductor device, and the second power rail is electrically disconnected from the second source/drain of the second semiconductor device, corresponding to a second logic value stored in the second semiconductor device, the second logic value different from the first logic value.

13. The ROM device of claim 10, wherein the first power rail is electrically coupled to the second source/drain of the first semiconductor device, corresponding to a first logic value stored in the first semiconductor device, and the second power rail is electrically coupled to the second source/drain of the second semiconductor device, corresponding to a second logic value stored in the second semiconductor device, the second logic value different from the first logic value.

14. The ROM device of claim 10, wherein
the first power rail is electrically coupled to the second source/drain of the first semiconductor device, corresponding to a first logic value stored in the first semiconductor device, and
the second power rail is electrically disconnected from the second source/drain of the second semiconductor device, corresponding to the first logic value stored in the second semiconductor device.

15. The ROM device of claim 10, wherein
the CFET device further comprises a local interconnect electrically coupling the first source/drain of the first semiconductor device to the first source/drain of the second semiconductor device.

16. The ROM device of claim 15, wherein
the first word line and the first power rail are over the CFET device,
the second word line and the second power rail are under the CFET device, and
the bit line is under and electrically coupled to the local interconnect.

17. A read-only memory (ROM) device, comprising:
a first complementary field effect transistor (CFET) device comprising:
a first semiconductor device of a first type; and
a second semiconductor device of a second type different from the first type, the second semiconductor device under or over the first semiconductor device;
a first word line electrically coupled to a gate of the first semiconductor device;
a first power rail electrically coupled to a first source/drain of the first semiconductor device;
a first bit line electrically coupled to a second source/drain of the first semiconductor device;
a second word line electrically coupled to a gate of the second semiconductor device;
a second power rail electrically coupled to a first source/drain of the second semiconductor device; and
a second bit line electrically coupled to a second source/drain of the second semiconductor device.

18. The ROM device of claim 17, further comprising:
a second CFET device comprising:
a first semiconductor device of the first type; and
a second semiconductor device of the second type, and under or over the first semiconductor device of the second CFET device,
wherein, for the second CFET device,
the first word line is electrically coupled to a gate of the first semiconductor device;
the first power rail is electrically coupled to a first source/drain of the first semiconductor device;
the second bit line is electrically coupled to a second source/drain of the first semiconductor device;
the second word line is electrically coupled to a gate of the second semiconductor device;
the second power rail is electrically coupled to a first source/drain of the second semiconductor device; and
the first bit line is electrically coupled to a second source/drain of the second semiconductor device.

19. The ROM device of claim 9, wherein
the first semiconductor device is physically over the second semiconductor device in a thickness direction of the ROM device,
the first source/drain of the first semiconductor device overlaps the first source/drain of the second semiconductor device along the thickness direction, and
the second source/drain of the first semiconductor device overlaps the second source/drain of the second semiconductor device along the thickness direction.

20. The ROM device of claim 19, further comprising:
a local interconnect extending between the first semiconductor device and the second semiconductor device along the thickness direction, and electrically coupling the first source/drain of the first semiconductor device to the first source/drain of the second semiconductor device; and
a via structure electrically coupling the local interconnect to the bit line.

* * * * *